(12) United States Patent
Bean, Jr.

(10) Patent No.: US 11,925,946 B2
(45) Date of Patent: Mar. 12, 2024

(54) FLUID DELIVERY WAND

(71) Applicant: Green Revolution Cooling, Inc., Austin, TX (US)

(72) Inventor: John Bean, Jr., Austin, TX (US)

(73) Assignee: Green Revolution Cooling, Inc., Austin, TX (US)

(*) Notice: Subject to any disclaimer, the term of this patent is extended or adjusted under 35 U.S.C. 154(b) by 74 days.

(21) Appl. No.: 17/705,494

(22) Filed: Mar. 28, 2022

(65) Prior Publication Data
US 2023/0302469 A1 Sep. 28, 2023

(51) Int. Cl.
*H05K 7/20* (2006.01)
*B05B 1/16* (2006.01)

(52) U.S. Cl.
CPC .......... *B05B 1/1663* (2013.01); *B05B 1/1672* (2013.01); *H05K 7/20236* (2013.01); *H05K 7/20272* (2013.01); *H05K 7/20772* (2013.01)

(58) Field of Classification Search
None
See application file for complete search history.

(56) References Cited

U.S. PATENT DOCUMENTS

| | | |
|---|---|---|
| 2,643,282 A | 6/1953 | Greene |
| 3,094,133 A | 6/1963 | Treanor |
| 3,320,762 A | 5/1967 | Murdoch |
| 3,406,244 A | 10/1968 | Sevgin |
| 3,450,265 A | 6/1969 | Kreusch et al. |
| 3,489,207 A | 1/1970 | Miller |
| 3,600,636 A | 8/1971 | Petersen |
| 3,754,741 A | 8/1973 | Whitehurst et al. |
| 3,858,090 A | 12/1974 | Lehmann |
| 4,034,335 A | 7/1977 | Harazoe et al. |
| 4,245,668 A | 1/1981 | Lindstrom |

(Continued)

FOREIGN PATENT DOCUMENTS

| | | |
|---|---|---|
| AU | 2009282170 B2 | 11/2014 |
| CN | 101443724 A | 5/2009 |

(Continued)

OTHER PUBLICATIONS

Applicant-Initiated Interview Summary from U.S. Appl. No. 13/057,881, dated Feb. 25, 2014, 4 pages.

(Continued)

*Primary Examiner* — Courtney L Smith
(74) *Attorney, Agent, or Firm* — THE MARBURY LAW GROUP, PLLC

(57) ABSTRACT

Various aspects include devices, systems, and methods for cooling electronic equipment immersed in an immersion coolant tank with a fluid delivery wand. The fluid delivery wand may include a coolant conduit and an aperture cover. The coolant conduit may extend from a support base of the immersion coolant tank. The coolant conduit may include a lumen configured to receive dielectric fluid, wherein the coolant conduit includes at least one conduit aperture extending through a sidewall of the coolant conduit. The aperture cover may be in sliding engagement with an outer surface of the sidewall of the coolant conduit. The aperture cover may be configured to selectively restrict flow of dielectric fluid through the at least one conduit aperture by sliding along the outer surface of the outer of the sidewall.

20 Claims, 11 Drawing Sheets

(56) References Cited

U.S. PATENT DOCUMENTS

| | | |
|---|---|---|
| 4,302,793 A | 11/1981 | Rohner |
| 4,313,310 A | 2/1982 | Kobayashi et al. |
| 4,399,501 A | 8/1983 | Masselin |
| 4,460,008 A | 7/1984 | O'Leary et al. |
| 4,464,315 A | 8/1984 | O'Leary |
| 4,493,010 A | 1/1985 | Morrison et al. |
| 4,590,538 A | 5/1986 | Cray, Jr. |
| 4,600,230 A | 7/1986 | Ise |
| 4,648,043 A | 3/1987 | O'Leary |
| 4,659,459 A | 4/1987 | O'Leary et al. |
| 4,704,658 A | 11/1987 | Yokouchi et al. |
| 4,741,385 A | 5/1988 | Bergles et al. |
| 4,834,257 A | 5/1989 | Book et al. |
| 5,102,503 A | 4/1992 | Silinski et al. |
| 5,145,585 A | 9/1992 | Coke |
| 5,260,850 A | 11/1993 | Sherwood et al. |
| 5,294,916 A | 3/1994 | Bolton et al. |
| 5,297,621 A | 3/1994 | Taraci et al. |
| 5,329,418 A | 7/1994 | Tanabe |
| 5,332,494 A | 7/1994 | Eden et al. |
| 5,414,591 A | 5/1995 | Kimura et al. |
| 5,574,627 A | 11/1996 | Porter |
| 5,851,143 A | 12/1998 | Hamid |
| 5,907,473 A | 5/1999 | Przilas et al. |
| 6,019,167 A | 2/2000 | Bishop et al. |
| 6,374,627 B1 | 4/2002 | Schumacher et al. |
| D477,617 S | 7/2003 | Resch |
| 6,600,656 B1 | 7/2003 | Mori et al. |
| 6,616,851 B1 | 9/2003 | Sforza-Heinen et al. |
| 6,621,707 B2 | 9/2003 | Ishimine et al. |
| D483,045 S | 12/2003 | Resch |
| 6,909,606 B2 | 6/2005 | Barsun et al. |
| 7,086,247 B2 | 8/2006 | Campbell et al. |
| D530,346 S | 10/2006 | Resch |
| 7,184,269 B2 | 2/2007 | Campbell et al. |
| 7,210,304 B2 | 5/2007 | Nagashima et al. |
| 7,278,273 B1 | 10/2007 | Whitted et al. |
| 7,307,841 B2 | 12/2007 | Berlin et al. |
| 7,318,322 B2 | 1/2008 | Ota et al. |
| 7,403,392 B2 | 7/2008 | Attlesey et al. |
| 7,413,394 B2 | 8/2008 | Risser |
| 7,511,959 B2 | 3/2009 | Belady et al. |
| 7,511,960 B2 | 3/2009 | Hillis et al. |
| 7,551,971 B2 | 6/2009 | Hillis |
| 7,609,518 B2 | 10/2009 | Hopton et al. |
| 7,686,175 B2 | 3/2010 | Waisanen |
| 7,724,513 B2 | 5/2010 | Coglitore et al. |
| 7,724,517 B2 | 5/2010 | Attlesey et al. |
| 7,757,506 B2 | 7/2010 | Ellsworth, Jr. et al. |
| 7,843,298 B2 | 11/2010 | Hosokawa et al. |
| 7,854,652 B2 | 12/2010 | Yates et al. |
| 7,856,838 B2 | 12/2010 | Hillis et al. |
| 7,905,106 B2 | 3/2011 | Attlesey |
| 7,911,782 B2 | 3/2011 | Attlesey et al. |
| 7,911,793 B2 | 3/2011 | Attlesey |
| 7,934,386 B2 | 5/2011 | Rummel et al. |
| 7,961,463 B2 | 6/2011 | Belady et al. |
| 7,971,632 B2 | 7/2011 | Eriksen |
| 7,983,040 B2 | 7/2011 | Campbell et al. |
| 8,009,419 B2 | 8/2011 | Attlesey et al. |
| 8,047,904 B2 | 11/2011 | Yates et al. |
| 8,213,261 B2 | 7/2012 | Imhof et al. |
| 8,295,047 B1 | 10/2012 | Hamburgen et al. |
| 8,310,829 B2 | 11/2012 | Monk et al. |
| 8,654,529 B2 | 2/2014 | Attlesey |
| 8,817,465 B2 | 8/2014 | Campbell et al. |
| 8,964,391 B2 * | 2/2015 | Campbell ............... F28F 3/048 |
| | | 361/679.53 |
| 9,042,098 B2 * | 5/2015 | Campbell .......... H05K 7/20818 |
| | | 361/698 |
| 9,049,800 B2 | 6/2015 | Shelnutt et al. |
| D744,996 S | 12/2015 | Keisling et al. |
| 9,269,544 B2 * | 2/2016 | Koo .................... H05H 1/2406 |
| 9,386,727 B2 | 7/2016 | Barringer et al. |
| 9,439,327 B1 * | 9/2016 | Sheng .................... H05K 7/207 |
| 9,504,190 B2 | 11/2016 | Best |
| 9,664,180 B2 | 5/2017 | Saavedra |
| 9,699,938 B2 * | 7/2017 | Shelnutt .................... G06F 1/20 |
| D796,654 S | 9/2017 | Baker et al. |
| 9,756,766 B2 | 9/2017 | Best |
| D821,326 S | 6/2018 | Kreiner |
| 9,992,914 B2 | 6/2018 | Best et al. |
| 10,123,463 B2 | 11/2018 | Best et al. |
| 10,212,849 B2 * | 2/2019 | Matsumoto ........ H05K 7/20272 |
| 10,306,804 B2 | 5/2019 | Chester et al. |
| D852,936 S | 7/2019 | Baker et al. |
| 10,342,164 B2 | 7/2019 | So et al. |
| 10,405,457 B2 | 9/2019 | Boyd et al. |
| D875,206 S | 2/2020 | Gourgel et al. |
| 10,743,438 B2 | 8/2020 | Wakino et al. |
| 10,820,446 B2 | 10/2020 | Boyd et al. |
| 11,359,865 B2 | 6/2022 | Stone et al. |
| 11,369,041 B2 * | 6/2022 | Yang .................. H05K 7/20272 |
| 11,516,943 B2 * | 11/2022 | Bilan ................. H05K 7/20236 |
| 2002/0014460 A1 | 2/2002 | McKay |
| 2002/0151799 A1 | 10/2002 | Pantages et al. |
| 2002/0185262 A1 | 12/2002 | Baer |
| 2002/0189173 A1 | 12/2002 | Staschik |
| 2003/0053293 A1 | 3/2003 | Beitelmal et al. |
| 2003/0127240 A1 | 7/2003 | Beckbissinger et al. |
| 2004/0008490 A1 | 1/2004 | Cheon |
| 2004/0013563 A1 | 1/2004 | Romer et al. |
| 2004/0050491 A1 | 3/2004 | Miya et al. |
| 2004/0223300 A1 | 11/2004 | Fink et al. |
| 2004/0246683 A1 | 12/2004 | Honsberg-Riedl et al. |
| 2004/0254682 A1 | 12/2004 | Kast |
| 2005/0011839 A1 | 1/2005 | Dart et al. |
| 2005/0024826 A1 | 2/2005 | Bash et al. |
| 2005/0052847 A1 | 3/2005 | Hamman |
| 2005/0083657 A1 | 4/2005 | Hamman |
| 2005/0111184 A1 | 5/2005 | Cliff et al. |
| 2005/0114876 A1 | 5/2005 | Atarashi et al. |
| 2005/0152112 A1 | 7/2005 | Holmes et al. |
| 2005/0259402 A1 | 11/2005 | Yasui et al. |
| 2006/0026610 A1 | 2/2006 | Sasao et al. |
| 2006/0064709 A1 | 3/2006 | Throckmorton et al. |
| 2006/0123436 A1 | 6/2006 | Tanaka et al. |
| 2006/0135042 A1 | 6/2006 | Frost et al. |
| 2006/0250755 A1 | 11/2006 | Tilton et al. |
| 2006/0274501 A1 | 12/2006 | Miller |
| 2007/0006599 A1 | 1/2007 | Kawamura et al. |
| 2007/0025081 A1 | 2/2007 | Berlin et al. |
| 2007/0034360 A1 | 2/2007 | Hall |
| 2007/0199340 A1 | 8/2007 | Knight et al. |
| 2007/0213000 A1 | 9/2007 | Day |
| 2007/0227710 A1 | 10/2007 | Belady et al. |
| 2007/0267741 A1 | 11/2007 | Attlesey et al. |
| 2008/0002364 A1 | 1/2008 | Campbell et al. |
| 2008/0017355 A1 | 1/2008 | Attlesey et al. |
| 2008/0026509 A1 | 1/2008 | Campbell et al. |
| 2008/0029250 A1 | 2/2008 | Carlson et al. |
| 2008/0030945 A1 | 2/2008 | Mojaver et al. |
| 2008/0055845 A1 | 3/2008 | Murakami et al. |
| 2008/0158818 A1 | 7/2008 | Clidaras et al. |
| 2008/0174954 A1 | 7/2008 | Vangilder et al. |
| 2008/0180908 A1 | 7/2008 | Wexler |
| 2008/0196868 A1 | 8/2008 | Attlesey et al. |
| 2008/0196870 A1 | 8/2008 | Attlesey et al. |
| 2008/0209931 A1 | 9/2008 | Stevens |
| 2008/0266726 A1 | 10/2008 | Murakami et al. |
| 2008/0270572 A1 | 10/2008 | Belady et al. |
| 2008/0273306 A1 | 11/2008 | Campbell et al. |
| 2009/0168345 A1 | 7/2009 | Martini |
| 2009/0229194 A1 | 9/2009 | Armillas |
| 2009/0251860 A1 | 10/2009 | Belady et al. |
| 2009/0260777 A1 | 10/2009 | Attlesey |
| 2009/0262455 A1 | 10/2009 | Merrow |
| 2009/0295167 A1 | 12/2009 | Clidaras et al. |
| 2010/0027212 A1 | 2/2010 | Daunert Armillas |
| 2010/0030267 A1 | 2/2010 | Winslow et al. |
| 2010/0061057 A1 | 3/2010 | Dersch et al. |
| 2010/0103618 A1 | 4/2010 | Campbell et al. |
| 2010/0139887 A1 | 6/2010 | Slessman |
| 2010/0165565 A1 | 7/2010 | Hellriegal et al. |

(56) References Cited

U.S. PATENT DOCUMENTS

| | | |
|---|---|---|
| 2010/0226094 A1 | 9/2010 | Attlesey et al. |
| 2010/0246118 A1 | 9/2010 | Attlesey |
| 2010/0263885 A1 | 10/2010 | Tuma |
| 2010/0275441 A1 | 11/2010 | Rasmussen et al. |
| 2010/0290190 A1 | 11/2010 | Chester et al. |
| 2010/0302678 A1 | 12/2010 | Merrow |
| 2011/0075353 A1 | 3/2011 | Attlesey et al. |
| 2011/0103019 A1 | 5/2011 | Campbell et al. |
| 2011/0120885 A1 | 5/2011 | Miller et al. |
| 2011/0132579 A1 | 6/2011 | Best et al. |
| 2011/0134604 A1 | 6/2011 | Attlesey |
| 2011/0151765 A1 | 6/2011 | Chen et al. |
| 2011/0157829 A1 | 6/2011 | Wormsbecher et al. |
| 2011/0240281 A1 | 10/2011 | Avery |
| 2011/0267775 A1 | 11/2011 | Vanderveen et al. |
| 2012/0026691 A1 | 2/2012 | Campbell et al. |
| 2012/0035773 A1 | 2/2012 | Stabinski et al. |
| 2012/0123595 A1 | 5/2012 | Bower, III et al. |
| 2012/0155027 A1 | 6/2012 | Broome et al. |
| 2012/0171943 A1 | 7/2012 | Dunnavant |
| 2012/0236487 A1 | 9/2012 | Wallace et al. |
| 2012/0294737 A1 | 11/2012 | Singh et al. |
| 2012/0300391 A1 | 11/2012 | Keisling et al. |
| 2013/0025888 A1 | 1/2013 | Eckholm et al. |
| 2013/0032217 A1 | 2/2013 | Pesek et al. |
| 2013/0075066 A1 | 3/2013 | Reytblat |
| 2013/0105120 A1 | 5/2013 | Campbell et al. |
| 2013/0105139 A1 | 5/2013 | Campbell et al. |
| 2013/0146273 A1 | 6/2013 | Chester et al. |
| 2014/0060773 A1 | 3/2014 | Wajima |
| 2014/0060799 A1 | 3/2014 | Eckberg et al. |
| 2014/0085817 A1 | 3/2014 | Campbell et al. |
| 2014/0085821 A1 | 3/2014 | Regimbal et al. |
| 2014/0109610 A1 | 4/2014 | Wulf et al. |
| 2014/0211412 A1 | 7/2014 | Best |
| 2014/0216686 A1 | 8/2014 | Shelnutt et al. |
| 2014/0218858 A1 | 8/2014 | Shelnutt et al. |
| 2014/0301037 A1 | 10/2014 | Best |
| 2014/0307384 A1 | 10/2014 | Best |
| 2014/0362527 A1 | 12/2014 | Best |
| 2015/0048950 A1 | 2/2015 | Zeighami et al. |
| 2015/0062806 A1 | 3/2015 | Shelnutt et al. |
| 2015/0138723 A1 | 5/2015 | Shedd et al. |
| 2015/0181762 A1 | 6/2015 | Boyd et al. |
| 2015/0195953 A1* | 7/2015 | Best .................. H05K 7/203 165/104.31 |
| 2015/0276292 A1 | 10/2015 | Son et al. |
| 2015/0305209 A1 | 10/2015 | Inaba et al. |
| 2015/0334880 A1 | 11/2015 | Best |
| 2016/0234970 A1 | 8/2016 | Shelnutt et al. |
| 2017/0142868 A1 | 5/2017 | Chen et al. |
| 2017/0265328 A1 | 9/2017 | Sasaki et al. |
| 2017/0303443 A1 | 10/2017 | Inano et al. |
| 2017/0332514 A1 | 11/2017 | Saito |
| 2018/0020571 A1* | 1/2018 | Saito .................. H05K 7/20636 |
| 2018/0020572 A1 | 1/2018 | Fujiwara et al. |
| 2018/0288906 A1 | 10/2018 | Hopton et al. |
| 2018/0368281 A1 | 12/2018 | Wang et al. |
| 2019/0090383 A1 | 3/2019 | Tufty et al. |
| 2019/0200482 A1 | 6/2019 | Boyd et al. |
| 2019/0387641 A1 | 12/2019 | Aoki et al. |
| 2020/0093038 A1* | 3/2020 | Enright .............. H05K 7/20318 |
| 2020/0323108 A1 | 10/2020 | Bilan et al. |
| 2021/0368656 A1 | 11/2021 | Heydari |
| 2021/0382533 A1 | 12/2021 | Heydari |
| 2022/0220976 A1 | 7/2022 | Perevozchikov et al. |

FOREIGN PATENT DOCUMENTS

| | | |
|---|---|---|
| CN | 109874275 A | 6/2019 |
| CN | 111240448 A | 6/2020 |
| GB | 82014500002000 | 5/2022 |
| JP | 2004319628 A | 11/2004 |
| JP | 2004363308 A | 12/2004 |
| JP | 2011518395 A | 6/2011 |
| JP | 2018019038 A | 2/2018 |
| JP | 2019161201 A | 9/2019 |
| JP | 2021519978 A | 8/2021 |
| WO | 2007023130 A2 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |
| WO | 2013022805 A1 | 2/2013 |
| WO | 2019061721 A1 | 4/2019 |
| WO | 2020234600 A1 | 11/2020 |

OTHER PUBLICATIONS

Applicant-Initiated Interview Summary from U.S. Appl. No. 13/057,881, dated Jul. 1, 2014, 3 pages.

Applicant-Initiated Interview Summary from U.S. Appl. No. 13/057,881, dated Oct. 9, 2014, 3 pages.

Bakker A., "Modeling Flow Fields in Stirred Tanks," Reacting Flows—Lecture 7, 2006, 40 pages.

Communication pursuant to Article 94(3) EPC for European Patent Application No. 09807136.8, dated Nov. 26, 2018, 13 pages.

"Disruptive Technologies," SC|09, Disruptive Technologies Presentations, Retrieved from http://sc09.supercomputing.org/index-pg=disrupttech.html, Nov. 14-20, 2009, 2 pages.

"Disruptive Technologies," SC10 Disruptive Technologies, Retrieved from http://sc10.supercomputing.org/index-og=disrupttech.html, Nov. 13-19, 2010, 8 pages.

Extended European Search Report for European Application No. 09807136.8, dated Jun. 6, 2017, 12 Pages.

Extended European Search Report for European Application No. 12821634.8, dated Jul. 15, 2015, 6 pages.

Final Office Action from U.S. Appl. No. 13/057,881, dated Jun. 16, 2015, 30 pages.

Final Office Action from U.S. Appl. No. 13/057,881, dated Nov. 22, 2013, 13 pages.

Final Office Action from U.S. Appl. No. 13/057,881, dated Nov. 3, 2014, 23 pages.

"GRC ICE Immersion Cooling Solutions Brochure," Retrieved from https://www.grcooling.com/wp-content/uploads/2018/06/GRC_ICE_Product_Brochure.pdf, Jun. 2018, 4 pages.

"GRC ICEraQ@ Series 10 Launch Event Presentation," Retrieved from https://digitalinfranetwork.com/videos/655447036-2/, Dec. 27, 2021, 1 page.

"GRC® Releases the Next Generation of Data Center Liquid Immersion Cooling, Providing Increased Sustainability Capable of Delivering a PUE Yield of 1.03 and a Significant Reduction in Operating Costs," Retrieved https://www.businesswire.com/news/home/20210518005857/en/GRC%C2%AE-Releases-the-Next-Generation-of-Data-Center-Liquid-Immersion-Cooling-Providing-Increased-Sustainability-Capable-of-Delivering-a-PUE-Yield-of-1.03-and-a-Significant-Reduction-in-Operating-Costs, May 18, 2021, 3 pages.

"Green Revolution Cooling Named a Disruptive Technology of the Year at SC'10," Press Release, Nov. 1, 2010, 1 page.

"Green Revolution Cooling Named Disruptive at SC'09," Press Release, Aug. 3, 2009, 1 page.

Hernandez P., "Are Liquid-Cooled Servers Coming to a Data Center Near You?," CleanTech, Dec. 4, 2009, 2 pages.

Hernandez P., "Will IT Managers Warm to Liquid-Cooled Servers?," Green Revolution Cooling, Dec. 8, 2009, 3 pages.

"ICEraQ 10 Quad Duo-Specification Sheet," Retrieved from https://www.grcooling.com/wp-content/uploads/2018/06/GRC_Data_Sheet_ICEraQ_Quad-Duo-One.pdf, 2021, 2 pages.

Intel, "Intel® Core™2 Duo Processor on 65 nm Process for Embedded Applications," Thermal Design Guide, Aug. 2007, pp. 1, 14, and 21.

Intel, "Intel® Pentium® 4 Processor on 90 nm Process," Datasheet, Feb. 2005, pp. 64-65.

"Intel Xeon Processor E7-4800/8800 v3 Product Families", May 2015, p. 46 (1 page).

(56) References Cited

OTHER PUBLICATIONS

International Preliminary Report on Patentability, Application No. PCT/US2014/033081, dated Oct. 15, 2015, 7 pages.
International Preliminary Report on Patentability, Application No. PCT/US2014/037005, dated Nov. 19, 2015, 12 bages.
International Preliminary Report on Patentability for International Application No. PCT/US2009/053305, dated Feb. 24, 2011, 19 pages.
International Preliminary Report on Patentability for International Application No. PCT/US2015/030618, dated Nov. 24, 2016, 10 pages.
International Search Report and Written Opinion for International Application No. PCT/US2009/053305, dated Oct. 14, 2009, 17 pages.
International Search Report and Written Opinion for International Application No. PCT/US20115/030618, dated Aug. 5, 2015, 12 pages.
International Search Report and Written Opinion for International Application No. PCT/US2012/049668, dated Oct. 19, 2012, 10 pages.
International Search Report and Written Opinion for International Application No. PCT/US2014/017835, dated Jun. 13, 2014, 9 pages.
International Search Report and Written Opinion for International Application No. PCT/US2014/033081, dated Aug. 27, 2014, 9 pages.
International Search Report and Written Opinion for International Application No. PCT/US2014/033834, dated Sep. 15, 2014, 16 pages.
International Search Report and Written Opinion for International Application No. PCT/US2014/037005, dated Sep. 24, 2014, 18 pages.
International Search Report and Written Opinion for International Application No. PCT/US2015/43468, dated Oct. 30, 2015, 11 pages.
International Search Report and Written Opinion for International Application No. PCT/US2021/058991, dated Mar. 3, 2022, 10 pages.
International Search Report and Written Opinion for International Application No. PCT/US2022/043817, dated Jan. 10, 2023, 10 pages.
Lee S.Y., "Hydraulics and Mixing Evaluations for NT-21/41 Tanks," Revision 0, Oct. 2014, 32 pages.
Markoff J., "Data Centers' Power Use Less Than Was Expected," The New York Times, Jul. 31, 2011, 3 pages.
Miller R, "Data Center Used to Heat Swimming Pool," Data Center Knowledge, Retrieved from https://www.datacenterknowledge.com/archives/2008/04/02/data-center-used-to-heat-swimming-pool, Apr. 2, 2008, 2 pages.
Non-Final Office Action in U.S. Appl. No. 14/667,091, dated May 22, 2015, 30 pages.
Non-final Office Action, U.S. Appl. No. 14/237,100, dated Sep. 30, 2015, 21 pages.
Non-final Office Action, U.S. Appl. No. 14/245,978, dated Jan. 13, 2016, 11 pages.
Non-final Office Action, U.S. Appl. No. 14/251,014, dated Dec. 4, 2015, 13 pages.
Non-final Office Action, U.S. Appl. No. 14/271,386, dated Dec. 17, 2015, 17 pages.
Notice of Acceptance for Australian Application No. 2009282170, dated Nov. 14, 2014, 2 pages.
Office Action and Search Report for Chinese Application No. 200980131707.3, dated Dec. 20, 2012, 17 pages.
Office Action for Canadian Application No. 2731994, dated Dec. 3, 2015, 6 pages.
Office Action for Canadian Application No. 2731994, dated Nov. 8, 2016, 4 pages.
Office Action for Chinese Application No. 200980131707.3, dated Apr. 18, 2014, 7 pages.
International Search Report and Written Opinion for International Application No. PCT/US2023/016342, dated Jul. 13, 2023, 8 pages.
Office Action for Chinese Application No. 200980131707.3, dated Dec. 31, 2014, 10 pages.
Office Action for Chinese Application No. 200980131707.3, dated Jul. 31, 2013, 8 pages.
Office Action for Chinese Application No. 201280049039.1, dated Oct. 27, 2015, 33 pages.
Office Action from U.S. Appl. No. 13/057,881, dated Apr. 11, 2014, 16 pages.
Office Action from U.S. Appl. No. 13/057,881, dated Jan. 9, 2015, 3 pages.
Office Action from U.S. Appl. No. 13/057,881, dated Jun. 4, 2013, 13 pages.
Office Action from U.S. Appl. No. 13/057,881, dated Mar. 3, 2015, 20 pages.
Park J, "New Cooling Strategies for Greater Data Center Energy Efficiency," Facebook, Nov. 4, 2010, 4 pages.
Patent Examination Report No. 2 for Australian Application No. 2009282170, dated Jun. 18, 2014, 4 pages.
Patent Examination Report No. 2 for Australian Application No. 2009282170, dated Nov. 15, 2013, 4 pages.
Substantive Examination Adverse Report for Malaysian Application No. PI2011000494, dated May 15, 2015, 3 pages.
Supplementary Examination Report for Singapore Application No. 11202000306X, dated Nov. 18, 2022, 4 pages.
"The Green500 List—Nov. 2013," The Green 500, Nov. 20, 2013, 3 pages.
U.S. Appl. No. 13/057,881, filed Feb. 7, 2011, Christiaan Scott Best, 72 pages.
U.S. Appl. No. 14/338,013, filed Jul. 22, 2014, Christiaan Scott Best, 60 pages.
U.S. Appl. No. 14/338,020, filed Jul. 22, 2014, Christiaan Scott Best, 60 pages.
U.S. Appl. No. 14/338,026, filed Jul. 22, 2014, Christiaan Scott Best, 60 pages.
U.S. Appl. No. 14/338,035, filed Jul. 22, 2014, Christiaan Scott Best, 60 pages.
U.S. Appl. No. 14/667,091, filed Mar. 24, 2015, Christiaan Scott Best, 65 pages.
Written Opinion and Search Report for Singapore Application No. 201100595-6, dated Apr. 16, 2012, 20 pages.
Written Opinion and Search Report for Singapore Application No. 201100595-6, dated May 2, 2012, 21 pages.
International Search Report and Written Opinion in PCT/US2023/032438, dated Dec. 27, 2023, 9 pages.

* cited by examiner

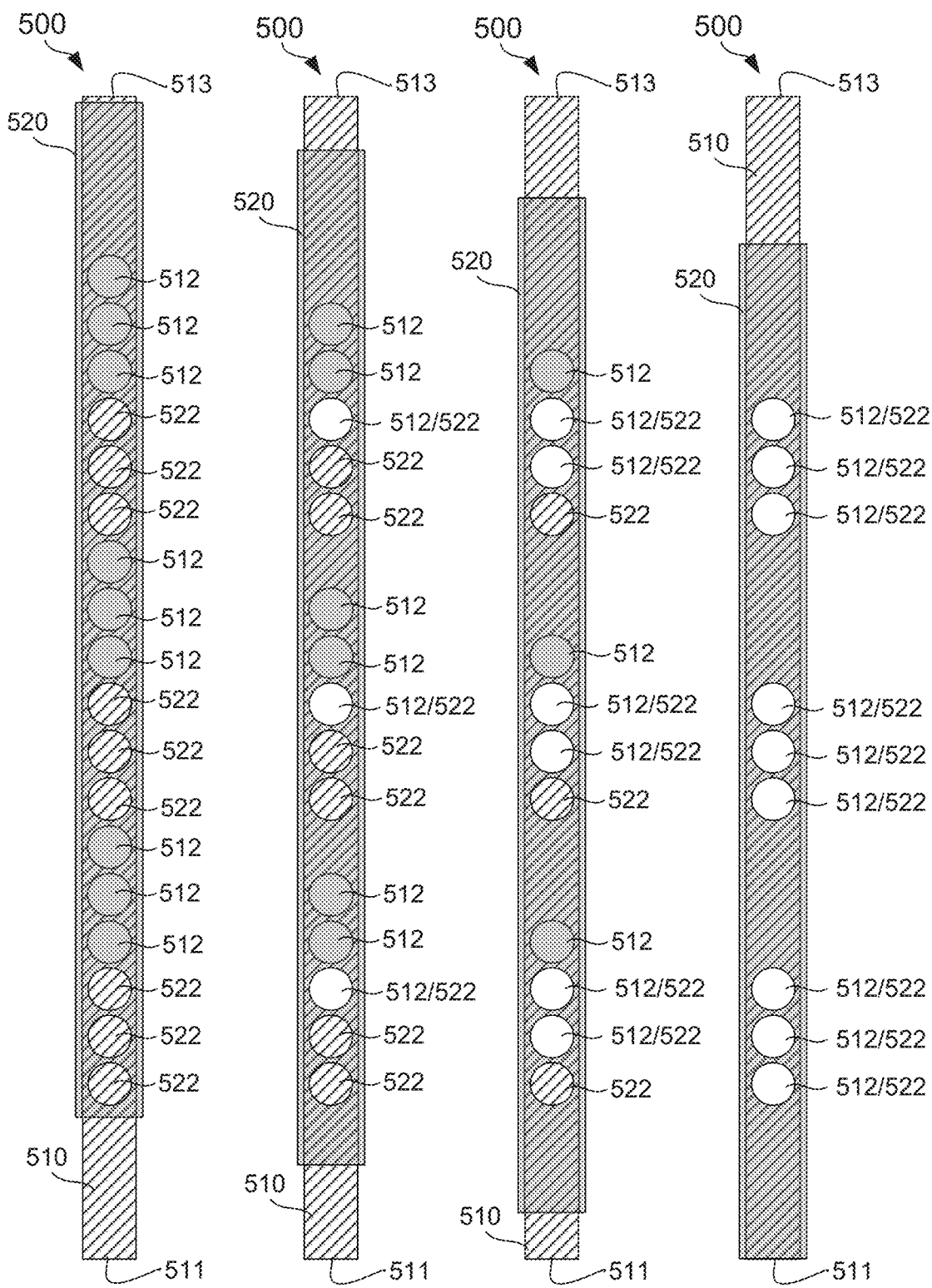

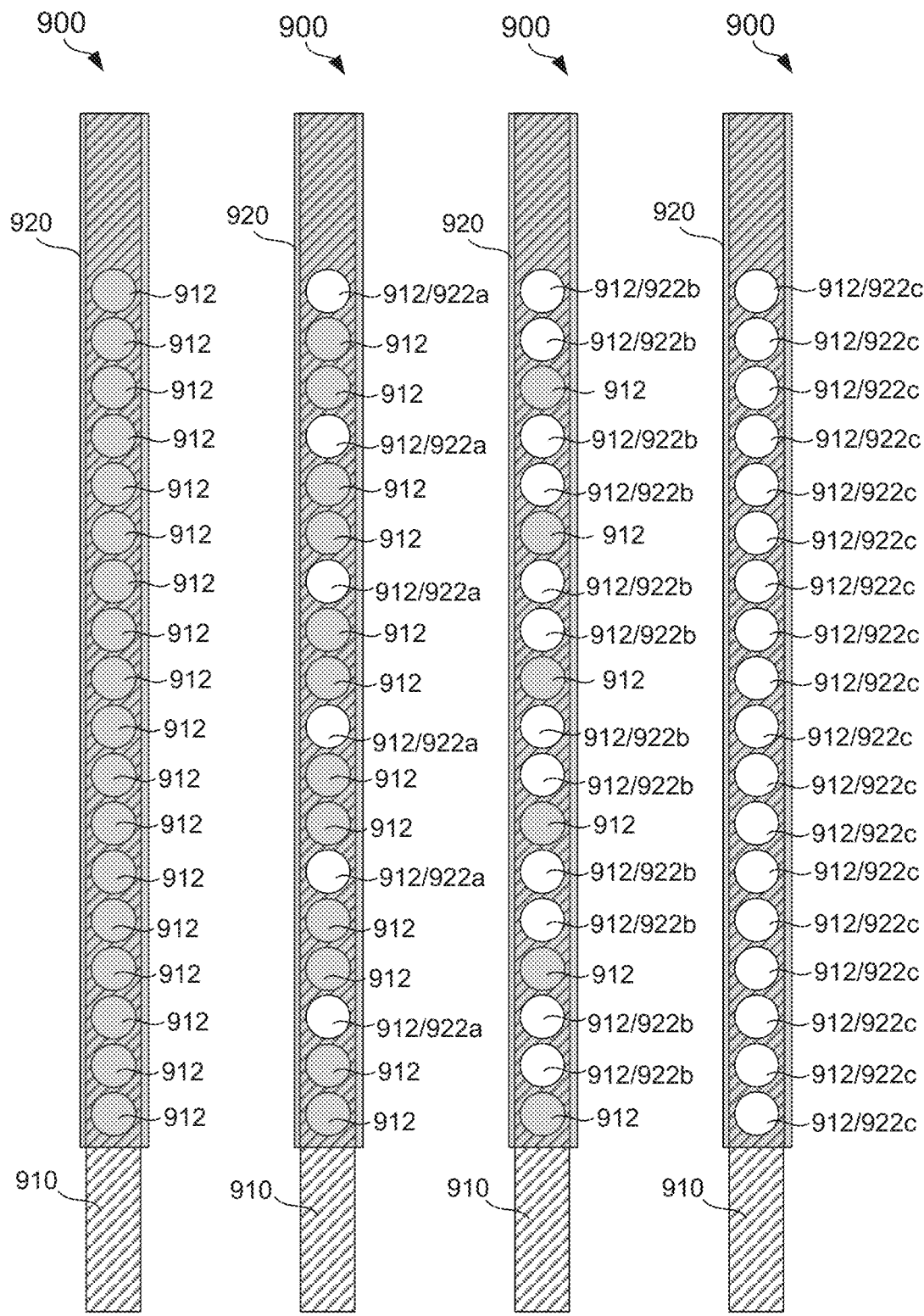

FLUID DELIVERY WAND

BACKGROUND

Immersion cooling racks provide a bath of dielectric fluid in a tank. Computer servers or other electronic equipment may be mounted on immersion cooling racks within the tank. The dielectric fluid may be circulated around computer servers or other electronic equipment as a liquid coolant such that heat generated by the electronic equipment can be rejected from one or more computer servers or other electronic equipment mounted within the tank. While the flow of the dielectric fluid in and around the heat-generating electronic equipment immersed in the tank helps remove heat from the electronic equipment generally, providing adequate localized cooling to some of the most intensive heat-generating elements of the electronic equipment, such as CPUs and GPUs, remains challenging.

SUMMARY

Various aspects include devices, systems, and methods for controlling how delivered dielectric fluid is directed toward electronic equipment immersed in an immersion coolant tank. The devices and systems may include a fluid delivery wand configured to selectively direct dielectric fluid toward the electronic equipment. The fluid delivery wand may include a coolant conduit and an aperture cover. The coolant conduit may extend from a support base of the immersion coolant tank. The coolant conduit may include a lumen configured to receive dielectric fluid, wherein the coolant conduit includes at least one conduit aperture extending through a sidewall of the coolant conduit. The aperture cover may be in sliding engagement with an outer surface of the sidewall of the coolant conduit. The aperture cover may be configured to selectively restrict flow of dielectric fluid through the at least one conduit aperture by sliding along the outer surface of the outer of the sidewall.

In some embodiments, the aperture cover may include at least one release aperture, wherein alignment of the at least one release aperture with the at least one conduit aperture enables dielectric fluid to flow through the at least one conduit aperture. By sliding along the outer surface of the sidewall, the aperture cover may be configured to move between at least a first position and a second position, wherein the first position enables a greater flow of dielectric fluid through the at least one conduit aperture than the second position. The movement between at least the first position and the second position may include a linear movement of the aperture cover extending parallel to a longitudinal axis of the coolant conduit. The movement between at least the first position and the second position may include a rotational movement of the aperture cover around a longitudinal axis of the coolant conduit.

In some embodiments, by sliding along the outer surface of the sidewall, the aperture cover may be configured to move between at least a fully open position, a semi-open position, and a closed position, wherein the fully open position enables a greater flow of dielectric fluid through the at least one conduit aperture than the semi-open position and the closed position prevents flow of dielectric fluid through the at least one conduit aperture.

In some embodiments, the at least one conduit aperture may include a plurality of conduit apertures spaced along a longitudinal axis of the coolant conduit. The fluid delivery device may further include an actuator attached to the support base, wherein the actuator may be configured to control a sliding movement of the aperture cover relative to the coolant conduit. The fluid delivery device may further include a base bracket forming an enclosure with two opposed walls on opposite sides of the coolant conduit. The two opposed walls may be configured to together receive a component of the electronic equipment seated thereon. The two opposed walls may extend parallel to a longitudinal axis of the coolant conduit.

In some embodiments, the aperture cover may be formed as a conduit sleeve that surrounds a circumference of the coolant conduit. Selectively directing dielectric fluid toward the electronic equipment may comprise directing the dielectric fluid toward an inlet face of an enclosure or chassis of the electronic equipment.

Various aspects may include a method of delivering fluid to an electronic equipment immersed in an immersion coolant tank. The method may include directing dielectric fluid to flow toward electronic equipment from at least one conduit aperture in a coolant conduit disposed within an immersion coolant tank. In addition, the coolant conduit may include a lumen configured to receive the dielectric fluid. Also, the least one conduit aperture may extend through a sidewall of the coolant conduit. The method may also include sliding an aperture cover along an outer surface of the sidewall of the coolant conduit. Sliding the aperture cover may control a flow of the dielectric fluid through the at least one conduit aperture.

In some embodiments, directing the dielectric fluid to flow from the at least one conduit aperture may include directing the dielectric fluid to flow from a plurality of conduit apertures spaced along a longitudinal axis of the coolant conduit. In some embodiments, directing the dielectric fluid to flow toward the electronic equipment may comprise directing the dielectric fluid toward an inlet face of an enclosure or chassis of the electronic equipment.

In some embodiments, sliding the aperture cover from at least a first position to a second position may enable a greater flow of dielectric fluid through the at least one conduit aperture. In some embodiments, sliding from at least the first position to the second position may include a linear movement of the aperture cover extending parallel to a longitudinal axis of the coolant conduit. In some embodiments, sliding from at least the first position to the second position may include a rotational movement of the aperture cover around a longitudinal axis of the coolant conduit. In some embodiments, sliding the aperture cover along the outer surface of the sidewall may move the aperture cover to one of a fully open position, a semi-open position, and a closed position. The fully open position may enable a greater flow of dielectric fluid through the at least one conduit aperture than the semi-open position and the closed position may prevent flow of dielectric fluid through the at least one conduit aperture.

In some embodiments, the method may additionally include activating an actuator. Sliding the aperture cover along the outer surface of the sidewall of the coolant conduit may be controlled by the actuator.

BRIEF DESCRIPTION OF THE DRAWINGS

The accompanying drawings, which are incorporated herein and constitute part of this specification, illustrate exemplary embodiments of the claims and together with the general description given above and the detailed description given below, serve to explain the features of the claims.

FIGS. 5A-5D are top views of an alternative linear controlled fluid delivery wand in closed, low-open, middle-open and high-open positions, respectively, in accordance with various embodiments.

FIGS. 9A-9D are top views of a rotational controlled fluid delivery wand in closed, low-open, middle-open and high-open positions, respectively, in accordance with various embodiments.

DETAILED DESCRIPTION

Figure 1A:
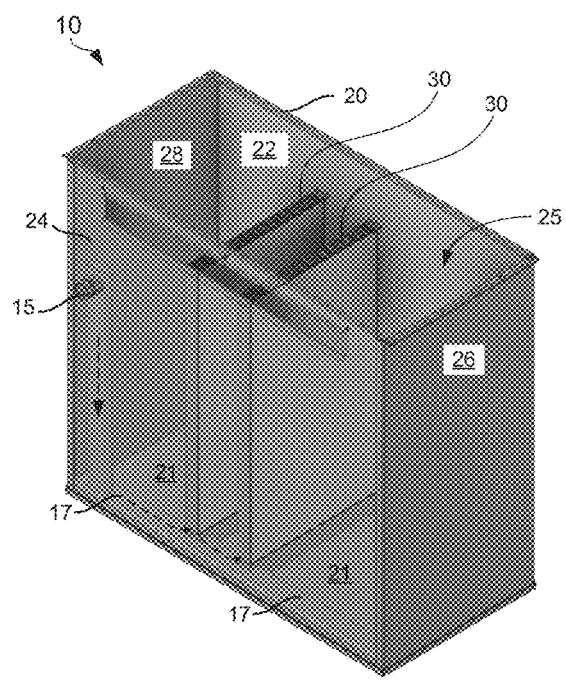
FIG. 1A a perspective view of an immersion coolant tank with a translucent rear wall showing two components of electronic equipment mounted therein in accordance with various embodiments.

Various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the claims.

Various embodiments enhance and direct flow rates to specific elements of electronic equipment within an immersion coolant tank and include techniques and devices that will help facilitate significant power handling increases in that equipment. Localized enhanced flow rates of dielectric fluid may improve performance of electronic equipment within the immersion coolant tank.

Certain components of electronic equipment, such as a server, namely the central processing unit (CPU), may benefit from additional cooling as compared to other components within the immersion coolant tank. This may be due to the CPU being the most intensive heat generating element. For example, cooling the internal spaces of a rack unit in a server rack may be challenging. However, sizing the entire fluid circulation system around providing adequate flow across the CPU or each rack unit for cooling purposes is generally impractical. Thus, various embodiments include a fluid delivery wand to promote additional and/or directed flow to particular electronic components, such as a server, rack unit, CPU, and/or other similar components. In particular, various embodiments may include fluid delivery wand that is configured to control and direct coolant flow into specific server "U" spaces within the coolant tank, rather than merely directing flow to specific components. Some U spaces may be empty and therefor need no flow, but other U spaces may have moderate power servers and need moderate flow, while others may have higher power servers needing even more flow.

Various embodiments disclosed herein include a fluid delivery wand for electronic equipment located within an immersion coolant tank. The fluid delivery wand may include a coolant conduit extending from a support base of a dielectric coolant tank. The coolant conduit may include a lumen configured to receive dielectric fluid emitted from the support base. Also, the coolant conduit may include at least one conduit aperture extending through a sidewall of the coolant conduit. The fluid delivery want may also include an aperture cover in sliding engagement with an outer surface of the sidewall of the coolant conduit. The aperture cover may be configured to selectively increase or restrict the flow of dielectric fluid through the at least one conduit aperture by sliding along an outer surface of the outer of the sidewall.

FIGS. 1A-1D illustrate an immersion coolant system 10 and elements thereof for immersing a rack of electronic equipment, such as independently operable servers, in a dielectric fluid. The immersion coolant system 10 may include an immersion coolant tank 20 and mounting members for mounting computer servers or other electronic equipment, as will be described in more detail hereinafter. The immersion coolant tank 20 may be fabricated of metal such as steel, aluminum or the like, a sufficiently strong plastic that is compatible with the dielectric fluid used as a cooling medium, or other suitable material. The immersion coolant tank 20 may face upward with an open top to form an open interior volume and may be shaped to have a length, width, and height with the minimum footprint to insert multiple components of electronic equipment 30 (e.g., server blades). Suitable mounting members may be used to mount the electronic equipment 30 in the immersion coolant tank 20. The immersion coolant tank 20 may be shaped, dimensioned, and sized such that multiple standard-sized components of electronic equipment 30 (e.g., servers) can be supported without significant modification.

The immersion coolant tank 10 may be fabricated to have an inlet port 15 for receiving cooled liquid coolant (e.g., cooled dielectric fluid). The cooled liquid coolant may be supplied through a piping system connected to a heat exchanger that outputs a flow of lower temperature or cooled liquid coolant to the immersion coolant tank 20. The inlet port 15 may open into an internal supply conduit 17 within the immersion coolant tank 10. For example, the internal supply conduit 17 may direct dielectric fluid from the inlet port 15 to a fluid delivery device, such as fluid delivery wands 100, 101 shown in FIG. 1B-1D. An outlet pipe or line (not shown) may also be connected to the immersion coolant tank 10 to remove coolant, that has been heated through exposure to the electronic equipment 30, from the immersion coolant tank 20 to an external heat exchanger associated with one or more heat-rejection or cooling systems.

The immersion coolant tank 20 may be sized and shaped according to the all the electronic components it is designed to hold. For example, the immersion coolant tank 20 may include front, back, left, and right walls 22, 24, 26, 28 that together with a tank floor 21 form a liquid-tight internal chamber 25 configured to hold both dielectric fluid and various components of electronic equipment 30. The immersion coolant tank 20 may be open on top. Although the immersion coolant tank 20 is depicted as a generally rectangular box, other shapes may be used as appropriate for the equipment being held and the location in which the immersion coolant tank 20 is located.

The configuration of electronic equipment within the immersion coolant tank 20 may have a number of different implementations. Preferably, mounting members are configured to receive multiple pieces of electronic equipment 30 (e.g., server blades) in a vertical orientation, thereby minimizing the footprint of the multiple pieces of electronic equipment 30 (e.g., servers) relative to the ground, and with a so-called "front" panel of the electronic equipment 30 facing upward for easy installation, removal, and manipulation from the immersion coolant tank 20 without the need to drain the dielectric fluid and/or remove or disturb any other component within the immersion coolant tank 20.

The mounting members may also be configured to mount each of the multiple pieces of electronic equipment 30 (e.g., server blades) such that the top level of the dielectric fluid completely submerges the front panel (i.e., the top) of the electronic equipment 30. Alternatively, the front panel of the electronic equipment 30 may lie just above the top surface level of the dielectric liquid for visual or physical access to controls, indicators, or another element thereon. As a consequence, a volume of liquid coolant (i.e., dielectric fluid) may surround and circulate about the multiple pieces of the electronic equipment 30.

Figure 1B:
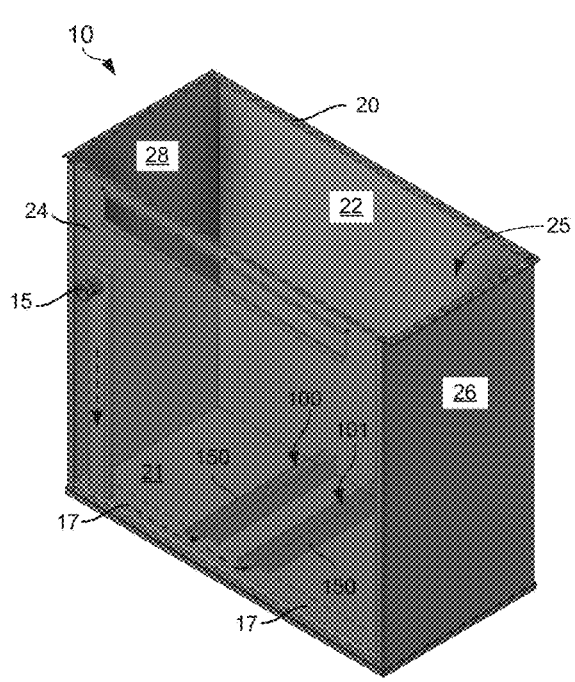
FIG. 1B a perspective view of the immersion coolant tank of FIG. 1A with the two components of electronic equipment removed to show fluid delivery devices configured to receive the two components of electronic equipment in accordance with various embodiments.
Figure 1C:
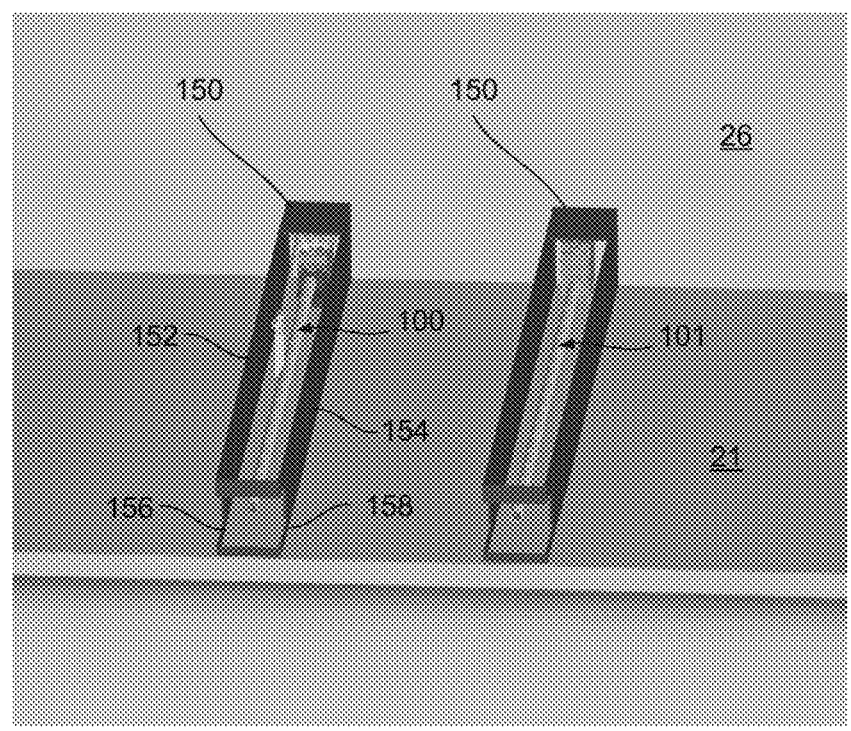
FIG. 1C is a close-up perspective view of the fluid delivery devices of FIG. 1B, in accordance with various embodiments.

As shown in FIGS. 1B and 1C, the mounting members may include one or more optional base brackets 150, each configured to receive a component of the electronic equipment 30 seated thereon. In particular, an inlet face of an enclosure or chassis of the electronic equipment may be configured to be seated in one of the optional base brackets 150. Additionally, the mount members (e.g., base brackets 150) may include hangers near the top of the immersion coolant tank 20 configured to support the electronic equipment 30. Unlike the base brackets 150, which may be configured to receive only a single component of the electronic equipment 30, the hangers may be configured to mount/receive one or more pieces of electronic equipment 30 thereon. The base brackets 150 may be part of a fluid delivery device configured to enhance flow rates of dielectric fluid to specific spaces in or around electronic equipment 30 in the immersion coolant tank 20. The base brackets 150 may not necessarily support the electronic equipment 30, but contain and/or help direct fluid delivery into the specific piece of electronic equipment 30 mounted therein.

The base brackets 150 may be fixedly secured to the tank floor 21. In accordance with various embodiments, each of the base brackets 150 may house a fluid delivery wand 100, 101 therein. The base brackets 150 may each form an enclosure with two opposed walls 152, 154 on opposite sides of the fluid delivery wand 100, 101. The two opposed walls 152, 154 may extend parallel to the fluid delivery wand 100, 101 enclosed there between. Also, the two opposed walls 152, 154 may extend from the front wall 22 to the rear wall 24, thereby defining an inner chamber bounded by the tank floor 21, the two opposed walls 152, 154, and two of the tank walls 22, 24 (and a component of the electronic equipment 30 subsequently seated thereon). In some embodiments, a rear end of each of the base brackets 150, or at least the two opposed walls 152, 154 thereof, may be formed with cutouts 156, 158 configured to butt up against and/or mate with a portion of the internal supply conduit 17. The internal supply conduit 17 may include inwardly facing delivery ports in locations coincident with an open rear end of the base brackets 150. In this way, the inwardly facing deliver ports may each face into the inner chamber of separate base brackets 150. Also, a rear end of each of the fluid delivery wands 100, 101 may be coupled to the inwardly facing delivery ports for receiving freshly cooled dielectric fluid from the internal supply conduit 17. Thus, rather than having the freshly cooled dielectric fluid flowing generally into the inner chamber of the base brackets 150, the dielectric fluid may be directed specifically into the fluid delivery wands 100, 101, which may then direct and control the flow of dielectric fluid therefrom.

The base brackets 150 may have an open top side, which is configured to receive the component of the electronic equipment 30 thereon. In particular, the two opposed walls 152, 154 may be configured to together receive the component of the electronic equipment 30 seated on upper edges thereof. In addition, the open top may be sized such that when a component of electronic equipment 30 is mounted thereon, the inner chamber of the base bracket 150 is substantially enclosed (i.e., closed off).

Figure 1D:
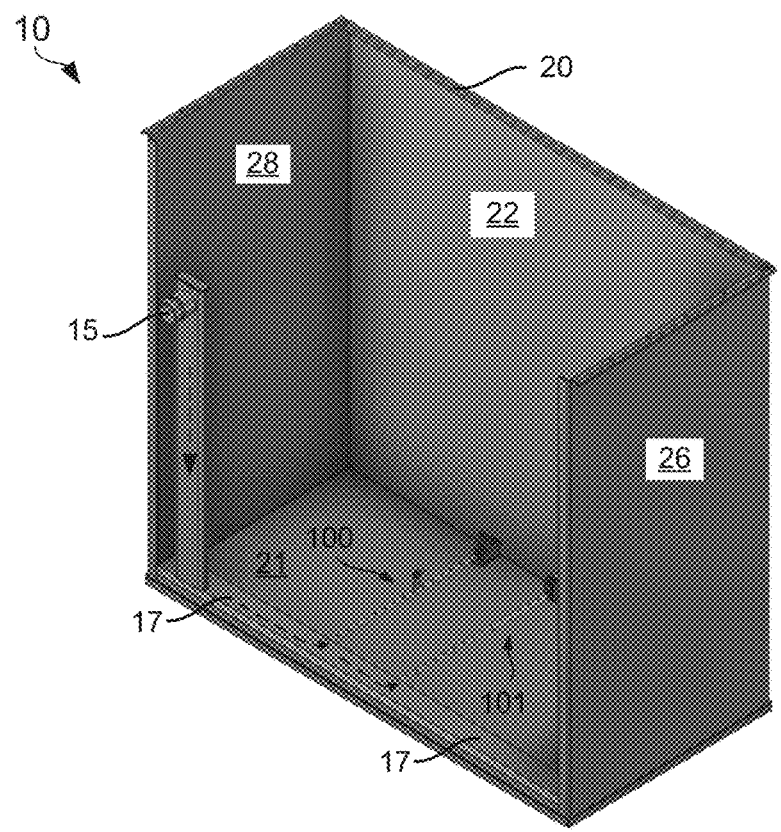
FIG. 1D a perspective view of the immersion coolant tank of FIGS. 1A and 1B with two base brackets of the fluid delivery devices removed to show the two fluid delivery wands, in accordance with various embodiments.

FIGS. 1B-1D illustrate further details of the fluid delivery device and particularly the fluid delivery wands 100, 101, which are configured to enhance the cooling of each respective piece of electronic equipment 30. In particular, FIGS. 1B-1D show two different types of fluid delivery wand 100, 101, namely a linearly controlled fluid delivery wand 100 and a rotationally controlled fluid delivery wand 101, in accordance with various embodiments as disclosed in more detail below. Although two different types of fluid delivery wands 100, 101 are illustrated, alternatively all fluid delivery wands in the immersion coolant tank 10 may be of the same type.

FIGS. 2-4C illustrate various aspects of a linearly controlled fluid delivery wand 100 in accordance with various embodiments. The linearly controlled fluid delivery wand 100 is configured to selectively direct dielectric fluid toward a component of electronic equipment 30 seated in the corresponding base bracket (e.g., 150). The linearly controlled fluid delivery wand 100 may include a coolant conduit 110 covered by an aperture cover 120.

The coolant conduit 110 may extend between a support base 140 and the supply conduit 17. Thus, a front end 113 of the coolant conduit 110 may be supported by the support base 140, while a rear end 111 of the coolant conduit 110 may be supported by an inwardly facing delivery port of the supply conduit 17. Both the support base 140 and the portion of the supply conduit 17 holding the coolant conduit 110 may be firmly secured to the tank floor (e.g., 21) and/or walls (e.g., 22, 24). In this way, the coolant conduit 110 may extend from the support base 140 to the supply conduit 17, traversing a bottom of the immersion coolant tank 20 from front to back. The coolant conduit 110 may include a lumen 125, at least one conduit aperture 112, 114, an opening at the rear end 111, and a closed-off front end connected to the support base 140. The lumen 125 may extend from the opening at the rear end 111 to the front end of the coolant conduit 110 or at least to the frontmost conduit aperture. The at least one conduit aperture 112, 114 may extend through a sidewall of the coolant conduit 110. In this way, the coolant conduit 110 may be configured to receive, at the rear end 110, dielectric fluid emitted from the supply conduit 17 (e.g., from one of the inwardly facing delivery ports). Once in the lumen 125, the dielectric fluid may then exit through the at least one aperture 112, 114, unless blocked or restricted by the aperture cover 120. In some embodiments, the coolant conduit 110 and/or lumen 125 may be movably affixed (e.g., with an accordion fitting that may move in a linear direction) to the supply conduit 17.

Figure 2:
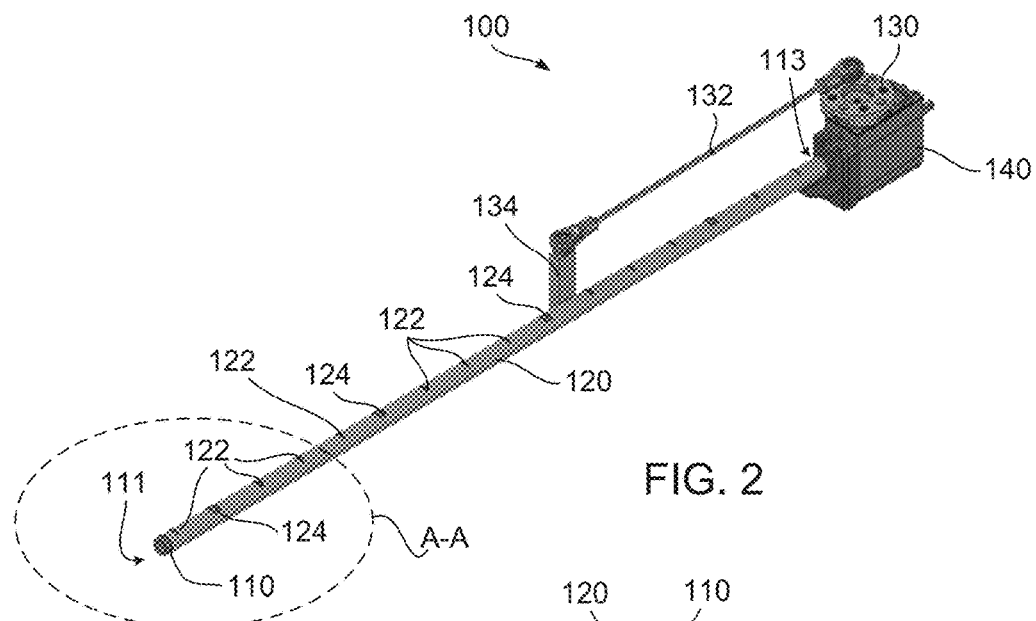
FIG. 2 is a perspective view of a linear movement fluid delivery wand with actuator in isolation in accordance with various embodiments.
Figure 3A:
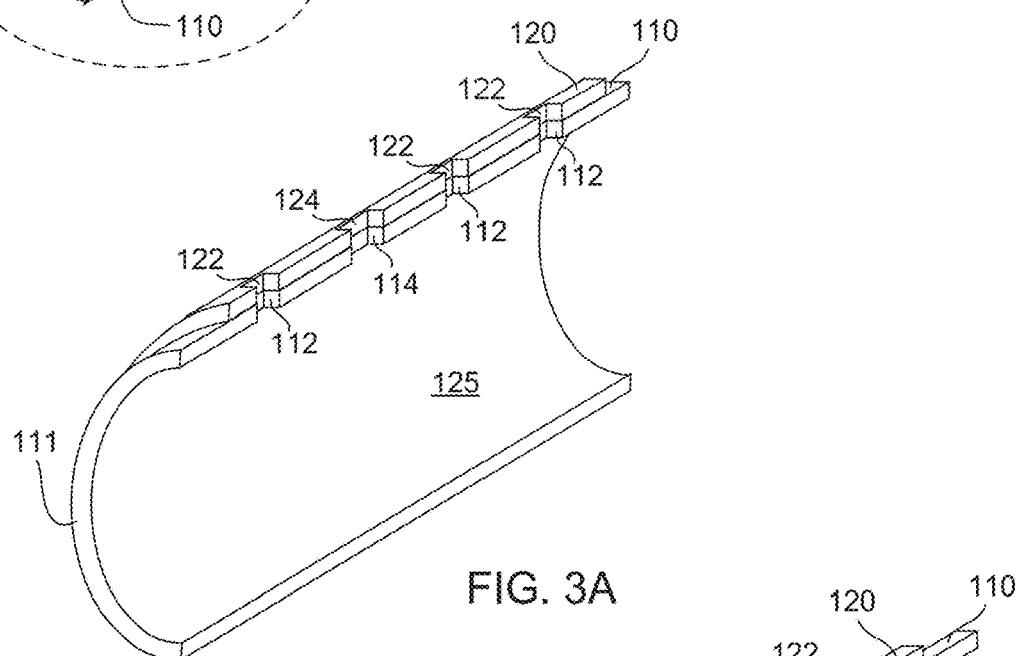
FIGS. 3A and 3B are cross-sectional relief views of the linear controlled fluid delivery wand of FIG. 2, at A-A, in open and closed positions, respectively, in accordance with various embodiments.
Figure 3B:
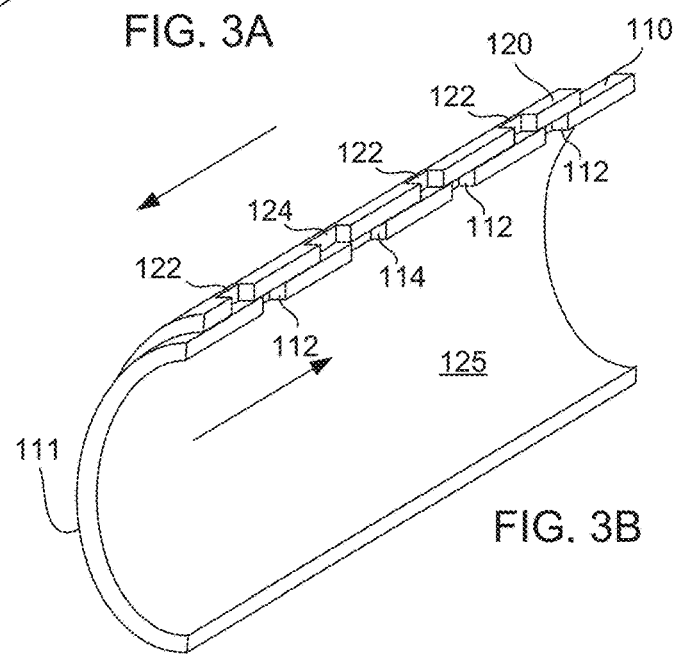

In various embodiments, the at least one conduit aperture 112, 114 may include a plurality of apertures. For example, the plurality of apertures 112, 114 may be spaced along a longitudinal axis of the coolant conduit 110. As shown in FIGS. 2-3B, in some embodiments the plurality of apertures may all be facing in the same direction in order to allow the flow of dielectric fluid in that facing direction. Alternatively, one or more of the plurality of conduit apertures may be facing in different directions in order to spread out the flow of dielectric fluid and/or direct the flow of dielectric fluid to a specific area on the inlet face of the electronic equipment 30. In some embodiments, a first one or more apertures 112 may be a first size and/or shape and a second one or more apertures 114 may be a different second size and/or shape. For example, each of the series of first apertures 112 may be smaller than each of the series of second apertures 114. Alternatively, the at least one conduit aperture 112, 114 may include a series of apertures that are all the same size and/or shape. As a further alternative, the at least one conduit aperture may include just a single aperture (see FIGS. 6A-6D).

The aperture cover 120 may be mounted over the coolant conduit 110 to encompass the coolant conduit. The aperture cover 120 may be in sliding engagement with an outer surface of the sidewall of the coolant conduit 110. By sliding along the outer surface of the coolant conduit 110, the aperture cover 120 may be configured to restrict or encourage the flow of dielectric fluid depending upon whether the aperture cover 120 is blocking the at least one aperture 112, 114. For example, FIG. 3A illustrates a first position, which corresponds to an open position in which the aperture cover 120 does not obstruct the at least one conduit aperture 112, 114 or at least a portion thereof.

In contrast, FIG. 3B illustrates a second position, which corresponds to a closed position in which the aperture cover 120 obstructs the at least one conduit aperture 112, 114. In this way, the first position (e.g., FIG. 3A) may enable a greater flow of dielectric fluid through the at least one conduit aperture 112, 114 than the second position (e.g., FIG. 3B). Also, additional positions may be achieved between the open and closed positions to provide one or more semi-open positions. For the linearly controlled fluid delivery wand 100, the movement between the first and second positions includes a linear movement of the aperture cover 120 relative to the coolant conduit 110. The linear movement extends parallel to a longitudinal axis of the coolant conduit 110. Thus, selective linear movement of the aperture cover 120 may restrict or encourage the flow of dielectric fluid through the at least one conduit aperture 112, 114.

In accordance with various embodiments, the aperture cover 120 may be formed as a conduit sleeve that wraps completely around a circumference of the coolant conduit 110. In this way, the coolant conduit 110 and the aperture cover 120 may be concentric with one another. Alternatively, the aperture cover 120 may not wrap completely around the circular circumference of the coolant conduit 110. For example, the aperture cover 120 may alternatively include a gap or slide that runs the entire length of the aperture cover 120. As yet a further alternative, the aperture cover 120 may be formed as one or more panels sized to only cover the at least one conduit aperture 112, 114 and not much more. In embodiments in which the aperture cover 120 may be formed as one or more panels, the aperture cover 120 may remain moveably attached to the coolant conduit 110 through a rail or pair of guide tracks configured to hold the one or more panels and guide their movement.

The linearly controlled fluid delivery wand 100 may be configured to selectively move the aperture cover 120 relative to the coolant conduit 100 in order to move from/to the open position, the closed position, and other positions therebetween. For example, from the open position illustrated in FIG. 3A, the aperture cover 120 may slide in a rearward direction toward the rear end 111 of the coolant conduit 110 at least until reaching the closed position illustrated in FIG. 3B. Optionally, stopping the movement of the aperture cover 120 somewhere between the open and closed position may result in a partially open (i.e., semi-open position) of greater or lesser degree depending on how much of the at least one conduit aperture 112, 114 is blocked by the aperture cover 120. In other embodiments, the coolant conduit 100 with the at least one conduit apertures 112, 114 may be linearly controlled to move in relation to a static aperture cover 120. Still further in other embodiments, multiple actuators may be used to move both the coolant conduit 100 and the aperture cover 120 in relation to one another.

In various embodiments, the aperture cover 120 may include at least one release aperture 122, 124. The size and shape of the at least one release aperture 122, 124 may match or be slightly larger than the at least one conduit aperture 112, 114. Thus, complete alignment of the at least one release aperture 122, 124 with the at least one conduit aperture 112, 114 may enable maximum dielectric fluid to flow through the at least one conduit aperture 112, 114. In operation, either the coolant conduit 100 may be moved in relation to the aperture cover 120 or vice versa such that there is partial alignment of the at least one release aperture 122, 124 with the at least one conduit aperture 112, 114 to provide a variable amount of dielectric fluid to flow through the at least one conduit aperture 112, 114.

In various embodiment, the at least one release aperture 122, 124 may include a plurality of apertures. For example, the plurality of release apertures may be spaced along a longitudinal axis of the aperture cover 120 spacing configured to align the release apertures with the at least one conduit aperture 112, 114 in one or more positions. As shown in FIGS. 2-3B, in some embodiments the plurality of release apertures may all be facing in the same direction in order to align with similarly positioned conduit apertures. Alternatively, one or more of the plurality of release apertures may be facing in different directions that correspond with similarly facing conduit apertures. In some embodiments, a first one or more of the release apertures 122 may be a first size and/or shape and a second one or more of the release apertures 124 may be a different second size and/or shape. For example, each of the series of first release apertures 122 is smaller than each of the series of second release apertures 124. Alternatively, the at least one release aperture may include a series of release apertures that are all the same size and/or shape. As a further alternative, the at least one release aperture may include just a single aperture. As yet a further alternative, the aperture cover 120 need not include any release apertures (see FIGS. 6A-6D).

In some embodiments, the length of linear movement may be limited such that all of the at least one conduit aperture 112, 114 may be fully obstructed. For example, moving less than all the way to the closed position (e.g., FIG. 3B) may result in only larger conduit apertures 114 remaining unobstructed. Alternatively, the aperture cover 120 may have some release apertures large enough that regardless of the position of the aperture cover 120, some dielectric fluid flow will always occur.

The linear movement of the linearly controlled fluid delivery wand 100 may be regulated using an actuator, such as one contained within the support base 140. An external power source and control circuit may provide the energy and control signals, respectively, to power and control the actuator. For example, a demand control algorithm executed by the control circuit may use metered power, measured from a component of electronic equipment 30 being cooled by that particular fluid delivery wand or information such as CPU silicon (die) temperature as process variables to dynamically control a position of the aperture cover 120 and regulate flow. The algorithm(s) may use open loop or closed loop methods. The actuator may be any device that may induce movement, such as a conventional electric motor (e.g., a stepper or servo motor), which generates rotary or direct linear movement. Alternatively, the actuator may be a linear motor, which in instead of producing rotational movement, provides a linear force along a length or alternately a piezoelectric actuator that directly creates discrete linear steps. The actuator may move either the aperture cover 120 and/or coolant conduit 110 in a continuous manner (i.e., analog fashion) or to predetermined positions (i.e., digital fashion). The aperture cover 120 may also be controlled in simple on-off motion by means of solenoid coil that creates linear motion of a ferromagnetic plunger surrounded by the solenoid coil. The ferromagnetic plunger may be directly coupled or coupled via linkage mechanically to the aperture cover, so that motion of the solenoid plunger may be translated into motion of the aperture cover 120.

Figures 4A, 4B, 4C:
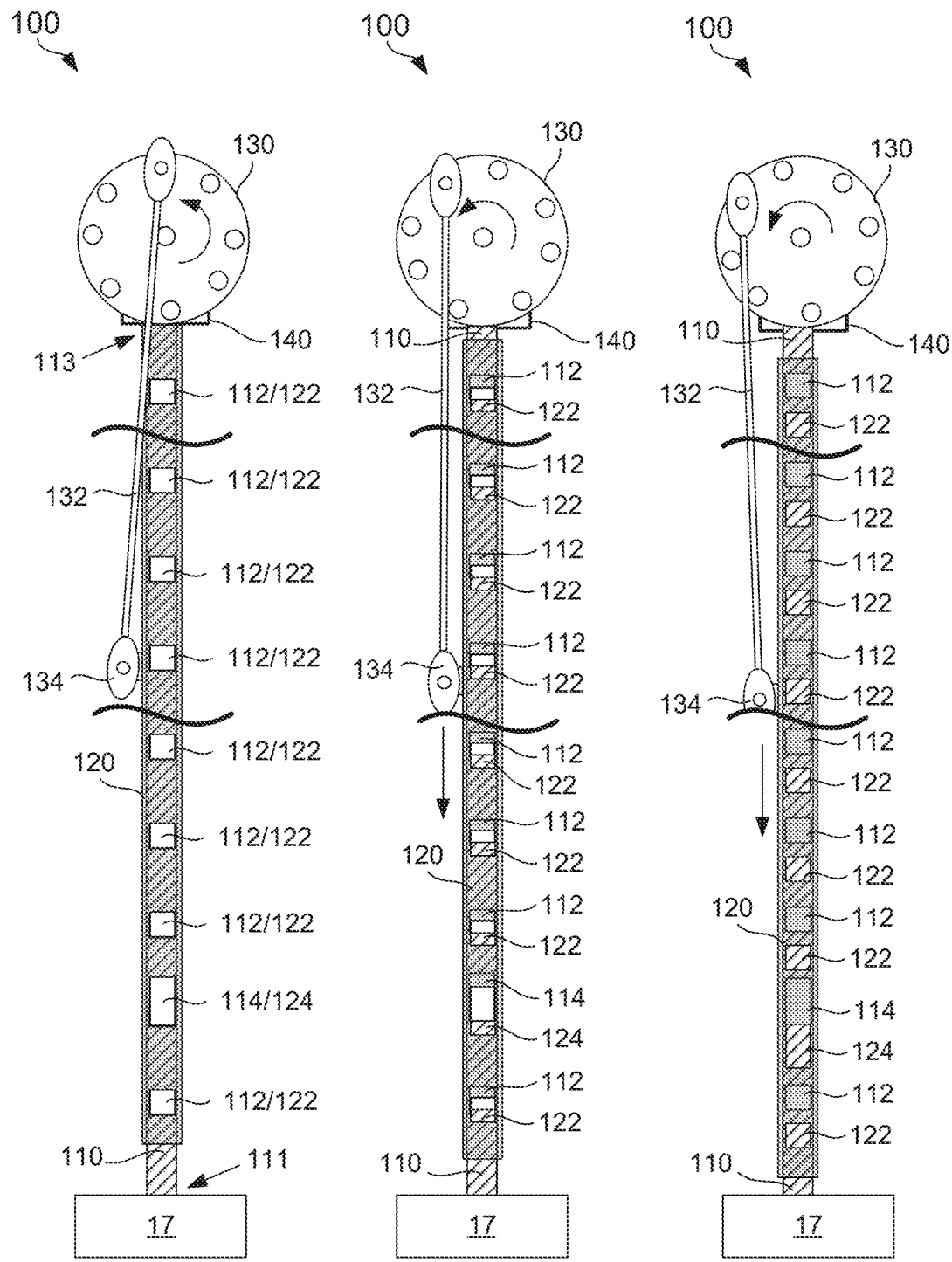
FIGS. 4A-4C are top views of the linear controlled fluid delivery wand of FIG. 2 in open, semi-open, and closed positions, respectively, in accordance with various embodiments.

FIGS. 4A-4C illustrate the linearly controlled fluid delivery wand 100, which includes an actuator at a front end 113, in the form of a conventional electric motor within the support base 140. A portion of the internal supply conduit 17 is illustrated supporting the linearly controlled fluid delivery wand 100 at a rear end 111. A rotary movement produced by such a conventional electric motor may be translated to linear movement with a translation wheel 130, control rod 132, and pivotal hitch 134 secured to the aperture cover 120. As shown, rotation of the translation wheel 130 is converted to linear movement of the aperture cover 120 as the control rod 132 pushes the aperture cover 120 from its attachment point at the pivotal hitch 134. While not illustrated in the figures, movement of the coolant conduit 110 in relation to the aperture cover 120 is within the contemplated scope of disclosure by coupling the translation wheel 130, control rod 132, and pivotal hitch 134 to a movable coolant conduit 110.

FIG. 4A illustrates an open position of the linearly controlled fluid delivery wand 100 in which the at least one conduit apertures 112, 114 are fully aligned with the at least one release apertures 122, 124 of the aperture cover 120. FIG. 4B illustrates a semi-open position of the linearly controlled fluid delivery wand 100 in which the at least one conduit apertures 112, 114 are only partially aligned with the at least one release apertures 122, 124. FIG. 4C illustrates a closed position of the linearly controlled fluid delivery wand 100 in which none of the at least one conduit apertures 112, 114 are even partially aligned with the at least one release apertures 122, 124. Alternatively, a stop may be provided or the linear movement of the aperture cover 120 limited by the actuator such that the larger conduit apertures 114 are never fully obstructed by the aperture cover.

FIGS. 5A-5D illustrate an alternative embodiment linear controlled fluid delivery wand 500 in isolation, without the support base (e.g., 140) or the portion of the internal supply conduit (e.g., 17). The embodiment linear controlled fluid delivery wand 500 may include a coolant conduit 510 and an aperture cover 520. The aperture cover 520 may be configured to move back and forth between a front end 513 and a rear end 511 of the coolant conduit 510. The coolant conduit 510 may include a plurality of similarly sized conduit apertures 512 grouped together with three conduit apertures 512 in each group. Similarly, the aperture cover 520 may include release apertures 522 similarly sized to one another and to the conduit apertures 512. Also, like the conduit apertures 512, the release apertures 522 grouped together with three conduit apertures 512 in each group. The spacing between the groups of apertures 512, 522 makes room for a closed position in which none of the conduit apertures 512 are aligned with any of the release apertures 522, as shown in FIG. 5A. Thus, the relative position of the coolant conduit 510 and the aperture cover 520 in FIG. 5A represents a closed position. While the embodiments of FIGS. 5A-5D are disclosed below as moving the aperture cover 520 relative to a static coolant conduit 510, embodiments in which the coolant conduit 510 may be moved relative to the aperture cover 520 or embodiments in which both the coolant conduit 510 and aperture cover 520 are configured to move are within the contemplated scope of disclosure.

In FIG. 5B, the aperture cover 520 may be moved toward the rear of the alternative linear controlled fluid delivery wand 500 (i.e., downward in the orientation shown in FIGS. 5A-5D), such that one conduit aperture 512, from each group of three conduit apertures 512, is aligned with one release aperture 522, from each group of three release apertures 522. The relative position of the coolant conduit 510 and the aperture cover 520 in FIG. 5B represents a low-open position, which corresponds to the lowest flow of dielectric fluid. Some embodiments may restrict the aperture cover 520 from moving beyond the low-open position (i.e., FIG. 5B) toward the closed position (i.e., FIG. 5A) so that some fluid flow is always allowed to flow from the alternative linear controlled fluid delivery wand 500.

In FIG. 5C, the aperture cover 520 may be moved further toward the rear of the alternative linear controlled fluid delivery wand 500, such that two conduit aperture 512, from each group of three conduit apertures 512, is aligned with two release aperture 522, from each group of three release apertures 522. The relative position of the coolant conduit 510 and the aperture cover 520 in FIG. 5C represents a middle-open position, which corresponds to a mid-level of flow of dielectric fluid.

In FIG. 5D, the aperture cover 520 may be moved even further toward the rear of the alternative linear controlled fluid delivery wand 500, such that all the conduit apertures 512 are each aligned with a corresponding one of the release apertures 522. The relative position of the coolant conduit 510 and the aperture cover 520 in FIG. 5D represents a high-open position, which corresponds to the highest flow of dielectric fluid.

The size, shape, and position of the fluid apertures may have a pronounced effect on the distribution of dielectric fluid flow. Although rectangular/square and circular apertures have been illustrated, it should be understood that alternatively the apertures may have a different shape, such as oval, triangular, tear-shaped, or other less traditional geometric shapes.

Figure 6A:
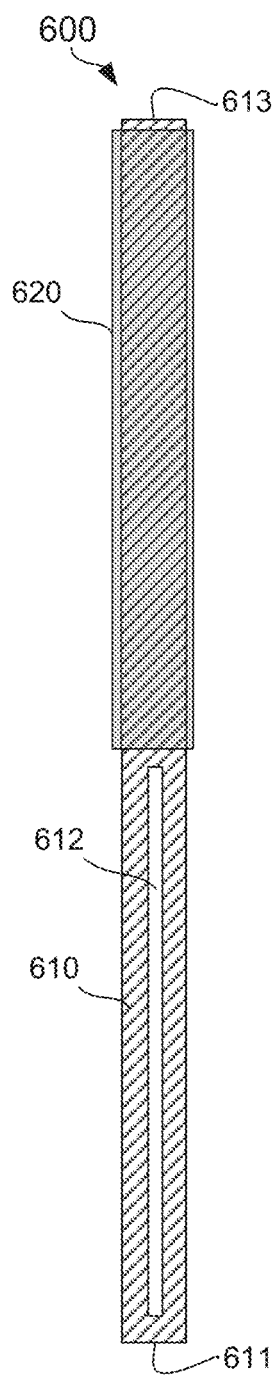
FIGS. 6A-6C are top views of a linear controlled fluid delivery wand in open, semi-open, and closed positions, respectively, in accordance with various embodiments.
Figure 6B:
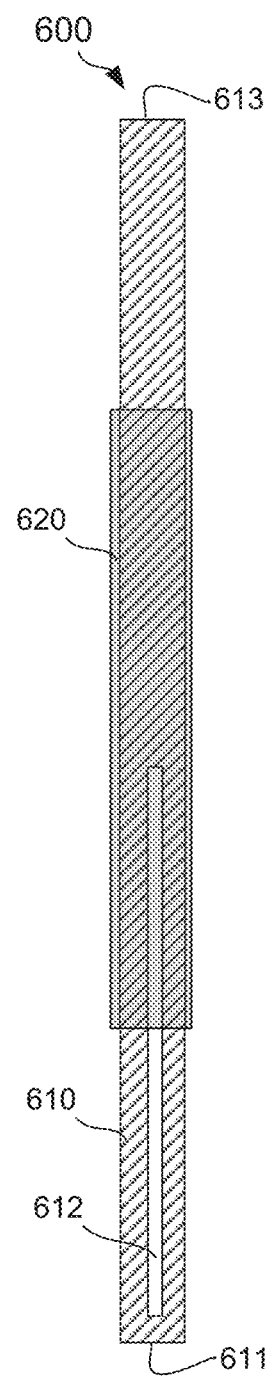
Figure 6C:
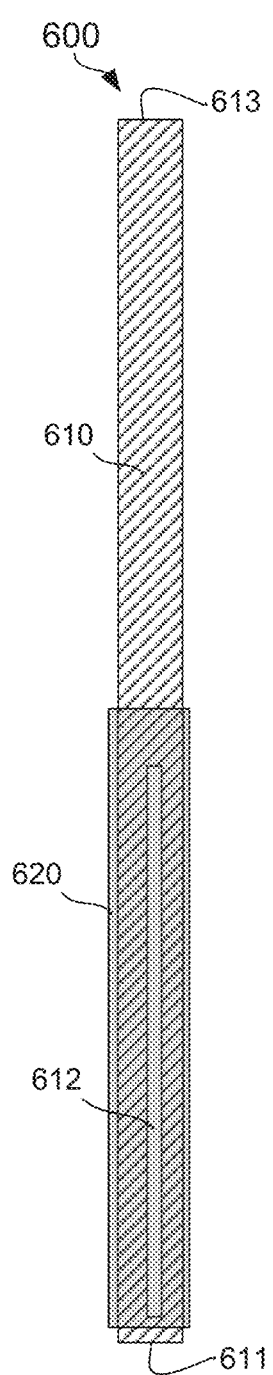

FIGS. 6A-6C illustrate a further alternative embodiment linear controlled fluid delivery wand 600 in isolation, without the support base (e.g., 140) or the portion of the internal supply conduit (e.g., 17). The further alternative linear controlled fluid delivery wand 600 may include a coolant conduit 610 and an aperture cover 620. The aperture cover 620 may be configured to move back and forth between a front end 613 and a rear end 611 of the coolant conduit 610. The coolant conduit 610 may include a single conduit aperture 612 in the form of an elongate slot. In contrast to the coolant conduit 610, the aperture cover 620 need not include any release apertures. With only a single conduit aperture 612, the flow rate of the further alternative linear controlled fluid delivery wand 600 may be controlled by regulating how much of the conduit aperture 612 is covered by the aperture cover 620. While the embodiments of FIGS. 6A-6C are disclosed below as moving the aperture cover 620 relative to a static coolant conduit 610, embodiments in which the coolant conduit 610 may be moved relative to the aperture cover 620 or embodiments in which both the coolant conduit 610 and aperture cover 620 are configured to move are within the contemplated scope of disclosure.

In FIG. 6A, the aperture cover 620 is not covering any part of the conduit aperture 612. Thus, the relative position of the coolant conduit 610 and the aperture cover 620 in FIG. 6A represents an open position. Such a position may provide maximum coolant flow.

In FIG. 6B, the aperture cover 620 is covering half of the conduit aperture 612. Thus, the relative position of the coolant conduit 610 and the aperture cover 620 in FIG. 6B represents a semi-open position. Such a position may provide a variable coolant flow.

In FIG. 6C, the aperture cover 620 is completely covering all of the conduit aperture 612. Thus, the relative position of the coolant conduit 610 and the aperture cover 620 in FIG. 6C represents a closed position. Such a position may provide minimum coolant flow. Some embodiments may restrict the aperture cover 520 from moving all the way to the closed position (i.e., FIG. 6C) so that some fluid flow is always allowed to flow from the further alternative linear controlled fluid delivery wand 600.

Figure 7:
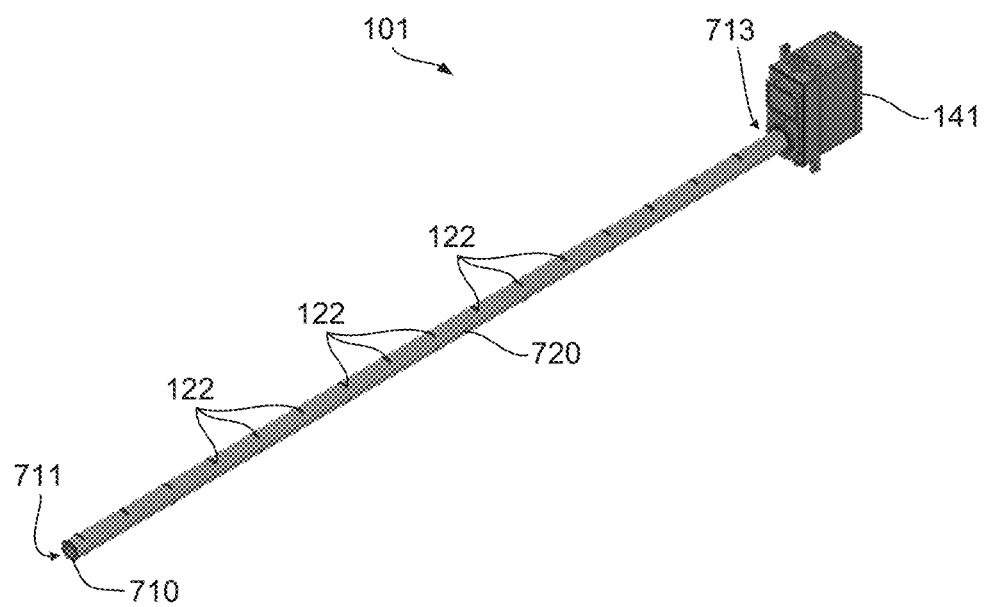
FIG. 7 is a perspective view of a rotational controlled fluid delivery wand with actuator in isolation in accordance with various embodiments.
Figure 8A:
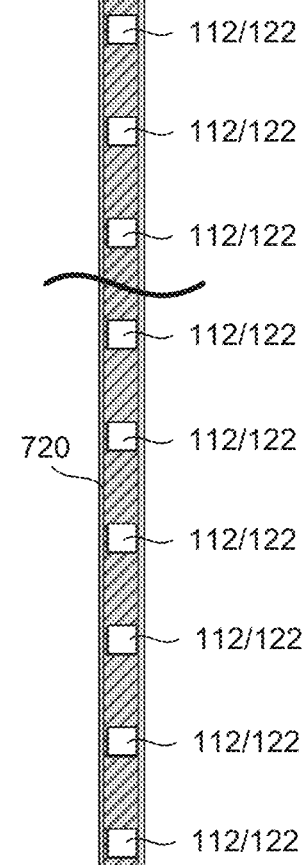
FIGS. 8A-8C are top views of the rotational controlled fluid delivery wand of FIG. 7 in open, semi-open, and open positions, respectively, in accordance with various embodiments.
Figure 8B:
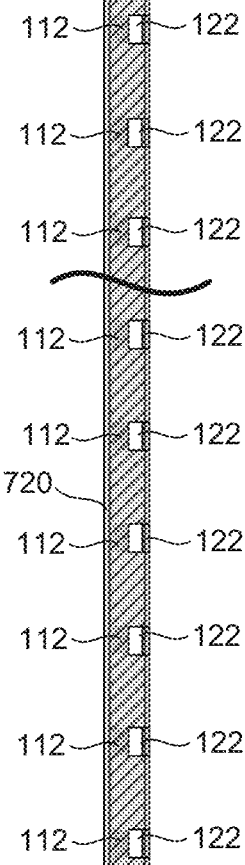
Figure 8C:
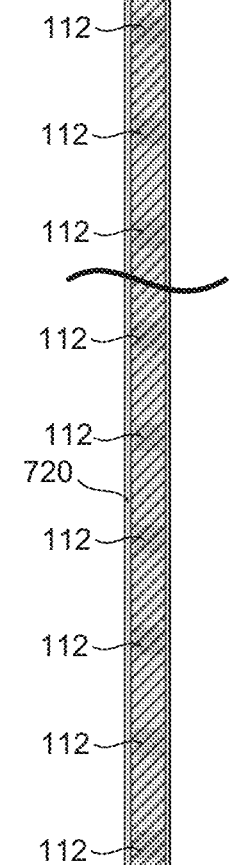

FIGS. 7-8C illustrate various aspects of a rotationally controlled fluid delivery wand 101 in accordance with various embodiments. The rotationally controlled fluid delivery wand 101 may also be configured to selectively direct dielectric fluid toward a face of the electronic equipment 30 seated in the corresponding base bracket (e.g., 150). The rotationally controlled fluid delivery wand 101 may include a coolant conduit 710 covered by an aperture cover 720. For the rotationally controlled fluid delivery wand 101, the movement between positions includes a rotational movement of the aperture cover 720 relative to the coolant conduit 710. The rotational movement of the aperture cover 720 may restrict or encourage the flow of dielectric fluid through the apertures 112.

Alternatively, the coolant conduit 710 may be configured to rotate relative to the aperture cover 720 that remains stationery. In this way, the relative movements between the coolant conduit 710 and the aperture cover 720 may be similar, but the coolant conduit 710 is the element actually rotating. As yet a further alternative, both the coolant conduit 710 and the aperture cover 720 may be configured to rotate together in order to change a radial direction of the fluid flow from the apertures 112 and the release apertures 122. For example, rather than directing the fluid flow vertically, rotation of the coolant conduit 710 and the aperture cover 720 together may tilt the direction of the fluid flow as desired.

The coolant conduit 710 may extend between a support base 141 and the supply conduit 17. Thus, a front end 713 of the coolant conduit 710 may be supported by the support base 141, while a rear end 711 of the coolant conduit 710 may be supported by an inwardly facing delivery port of the supply conduit 17. Both the support base 141 and the portion of the supply conduit 17 holding the coolant conduit 710 may be firmly secured to the tank floor (e.g., 21) and/or walls (e.g., 22, 24). In this way, the coolant conduit 710 may extend from the support base 141 to the supply conduit 17, traversing a bottom of the immersion coolant tank 20 from front to back. While the embodiments of FIGS. 7-8C are disclosed below as rotationally moving the aperture cover 720 relative to a static coolant conduit 710, embodiments in which the coolant conduit 710 may be moved relative to the aperture cover 720 or embodiments in which both the coolant conduit 710 and aperture cover 720 are configured to move are within the contemplated scope of disclosure. For example, while the supply conduit 17 may be firmly secured to the tank floor 21, in some embodiments the coolant conduit 710 may be flexibly secured to the supply conduit 17 to allow the coolant conduit 710 to move in a rotatably manner relative to a aperture cover 720.

The coolant conduit 710 may be similar to the coolant conduit 110 described above, including any one or more aspects of the embodiments related thereto. For example, the coolant conduit 710 may include a lumen, conduit apertures 112, an opening at the rear end 711, and a closed-off front end connected to the support base 141. In this way, the coolant conduit 710 may be configured to receive, through the opening at the rear end 710, dielectric fluid emitted from the supply conduit 17 (e.g., from one of the inwardly facing delivery ports). Once in the lumen, the dielectric fluid may then exit through the apertures 112, unless blocked by the aperture cover 720. In accordance with various embodiments, the apertures 112 in the coolant conduit 710 may all be facing in the same direction, aligned in one row. Although the coolant conduit 710 is illustrative with only one size conduit aperture 112, it should be understood that the sizes, shapes, grouping, and position of the conduit apertures may be modified as appropriate.

The aperture cover 720 may be mounted on the coolant conduit 710 and may be in rotational engagement with an outer surface of the sidewall of the coolant conduit 710. By rotating around the outer surface of the coolant conduit 710, the aperture cover 720 may be configured to restrict or encourage the flow of dielectric fluid depending upon whether the aperture cover 720 is blocking the apertures 112. For example, FIG. 8A illustrates a first position, which corresponds to an open position in which the aperture cover 720 does not obstruct the conduit apertures 112 or even a portion thereof. Thus, the first position may provide for maximum coolant flow through the apertures 112 and release apertures 122.

In contrast, FIG. 8B illustrates a second position, which corresponds to a semi-open position in which the aperture cover 720 only partially obstructs the conduit apertures 112. Thus, the second position may provide for a variable coolant flow through the apertures 112 and release apertures 122. The movement between the first and second positions is achieved by a rotational movement of the aperture cover 720 around a longitudinal axis of the coolant conduit 710. The first position (e.g., FIG. 8A) may enable a greater flow of dielectric fluid through the conduit apertures 112 than the second position (e.g., FIG. 8B). FIG. 8C illustrates a third position, which corresponds to a closed position in which the aperture cover 720 obstructs all the conduit apertures 112. Thus, the third position may provide for minimum coolant flow through the apertures 112 and release apertures 122. Some embodiments may restrict the aperture cover 720 from rotating to the closed position (i.e., FIG. 8C) so that some fluid flow is always allowed to flow from the rotationally controlled fluid delivery wand 101.

The rotational movement of the rotationally controlled fluid delivery wand 101 may be regulated using an actuator, such as one contained within the support base 141. The actuator within support base 141 may operate, be powered, and controlled similarly to the actuator in support base 140 described above. However, in contrast to the actuator in support base 140, the actuator in support base 141 may directly apply rotational movement to the aperture cover 720 to control rotational movement around the coolant conduit 710. The actuator may rotate either the aperture cover 120 and/or coolant conduit 110 in a continuous manner (i.e., analog fashion) or to predetermined positions (i.e., digital fashion).

FIGS. 9A-9D illustrate an alternative rotationally controlled fluid delivery wand 900 in isolation, without the support base (e.g., 141) or the portion of the internal supply conduit (e.g., 17). The alternative rotationally controlled fluid delivery wand 900 may include a coolant conduit 910 and an aperture cover 920. The aperture cover 920 may be configured to rotate around a longitudinal axis of the coolant conduit 910. The coolant conduit 910 may include a plurality of similarly sized conduit apertures 912 all aligned in one row. In contrast, the aperture cover 720 may include multiple rows of release apertures 122. Each row of release apertures 720 may include a different number of release apertures. The greater the number of release apertures 720, the higher the flow rate of dielectric fluid from that corresponding row.

In FIG. 9A, the aperture cover 920 may be rotated such that no release apertures (e.g., 922) may be aligned with the conduit apertures 912. The relative position of the coolant conduit 910 and the aperture cover 920 in FIG. 9A represents a closed position, which corresponds to no flow of dielectric fluid. Some embodiments may restrict the aperture cover 920 from moving beyond a low-open position (i.e., FIG. 9B) toward the closed position (i.e., FIG. 9A) so that some fluid flow is always allowed to flow from the alternative linear controlled fluid delivery wand 900.

In FIG. 9B, the aperture cover 920 may be rotated such that a first row of release apertures 922a may be aligned with some of the conduit apertures 912. As shown, the first row of release apertures only includes one release aperture 922a for every three conduit apertures 912. The relative position of the coolant conduit 910 and the aperture cover 920 in FIG. 9B represents a low-open position, which corresponds to the lowest flow of dielectric fluid.

In FIG. 9C, the aperture cover 920 may be rotated further such that a second row of release apertures 922b may be aligned with more of the conduit apertures 912. As shown, the second row of release apertures includes two release aperture 922b for every three conduit apertures 912. The relative position of the coolant conduit 910 and the aperture cover 920 in FIG. 9C represents a middle-open position, which corresponds to a mid-level of flow of dielectric fluid.

In FIG. 9D, the aperture cover 920 has moved even further to a third row of release apertures 922c, such that all the conduit apertures 912 may be each aligned with a corresponding one of the release apertures 922c. The relative position of the coolant conduit 910 and the aperture cover 920 in FIG. 9D represents a high-open position, which corresponds to the highest flow of dielectric fluid.

Figure 10:
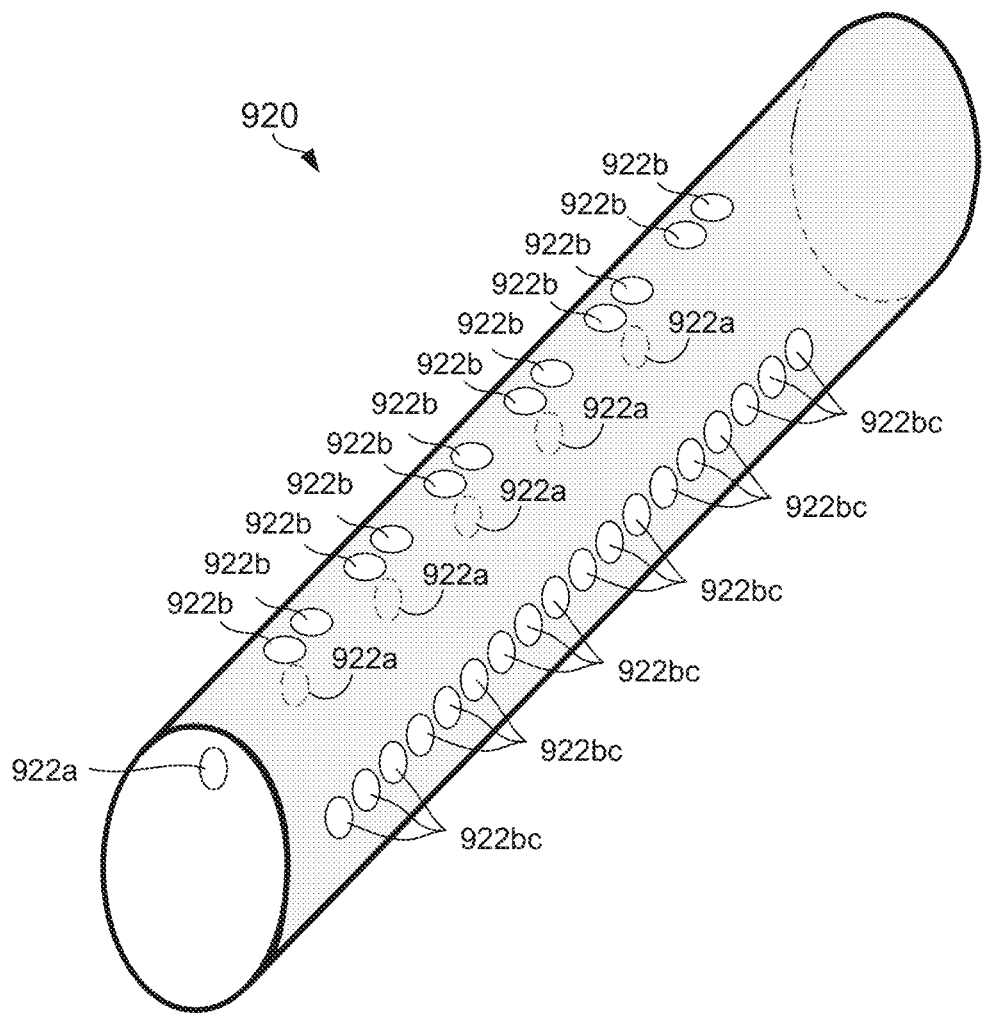
FIG. 10 is a perspective view of the aperture cover of the rotational movement fluid delivery wand of FIGS. 9A-9D.

FIG. 10 illustrates a perspective view of the aperture cover 920 in isolation. In the orientation shown, a bottom side of the aperture cover 920 (in the orientation shown in FIG. 10) includes no release apertures. Alignment of the bottom side of the aperture cover 920 with the conduit apertures (e.g., 912) will place the alternative rotationally controlled fluid delivery wand (e.g., 900) in a closed position (e.g., FIG. 9A). A left side of the aperture cover 920 (on the background side in the orientation shown) includes a first row of single release apertures 922a spaced evenly apart. Alignment of the left side of the aperture cover 920 with the conduit apertures (e.g., 912) will place the alternative rotationally controlled fluid delivery wand (e.g., 900) in a low-open position (e.g., FIG. 9B). A top side of the aperture cover 920 (on the top side in the orientation shown) includes a second row of release apertures 922b in pairs, spaced evenly apart from other pairs of release apertures 922b. Alignment of the top side of the aperture cover 920 with the conduit apertures (e.g., 912) will place the alternative rotationally controlled fluid delivery wand (e.g., 900) in a middle-open position (e.g., FIG. 9B), which corresponds to a mid-level of flow of dielectric fluid. A right side of the aperture cover 920 (on the foreground side in the orientation shown) includes a third row of release apertures 922c spaced evenly apart and configured to align with all the conduit apertures 912. Alignment of the right side of the aperture cover 920 with the conduit apertures (e.g., 912) will place the alternative rotationally controlled fluid delivery wand (e.g., 900) in a high-open position (e.g., FIG. 9D), which corresponds to the highest flow of dielectric fluid.

Figure 11A:
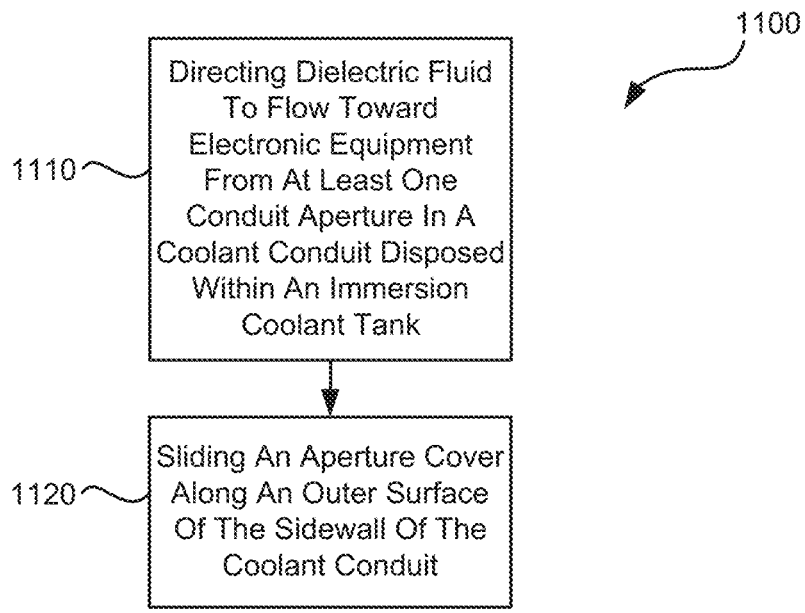
FIGS. 11A-11B illustrate embodiment methods of delivering fluid to an electronic equipment immersed in an immersion coolant tank, in accordance with various embodiments as described above with reference to FIGS. 1A-10.
Figure 11B:
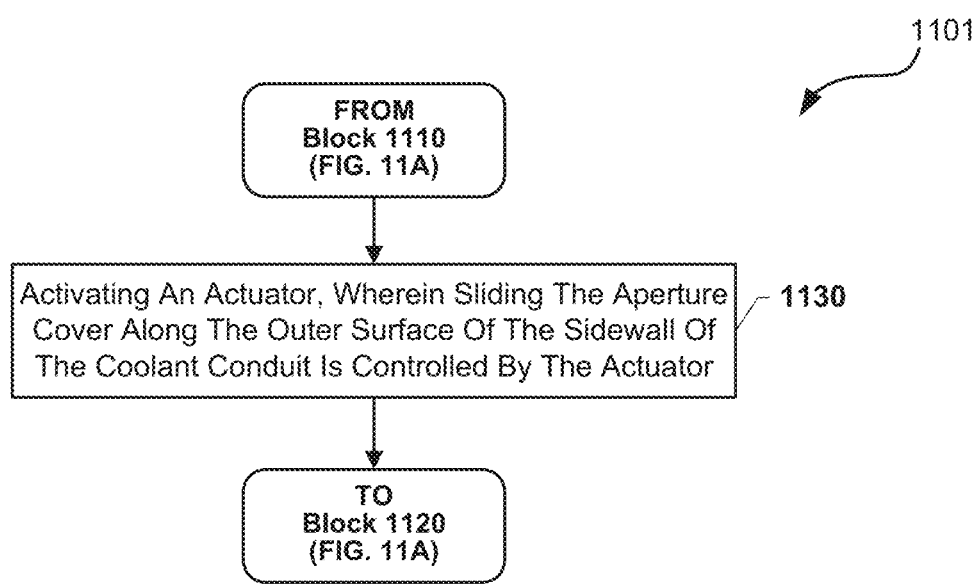

FIGS. 11A-11B illustrate embodiment methods 1100, 1101 of delivering fluid to an electronic equipment immersed in an immersion coolant tank, in accordance with various embodiments as described above with reference to FIGS. 1A-10. With reference to FIGS. 11A-11B, the methods 1100, 1101 and the operations thereof may be performed using a fluid delivery device (e.g., 10) configured to deliver fluid to electronic equipment immersed in an immersion coolant tank, as described herein. For example, the methods 1100, 1101 and the operations thereof may be performed using a fluid delivery wand (e.g., 100, 101, 500, 600, 900). In addition, the methods 1100, 1101 and the operations thereof may be performed using an actuator (e.g., 130, 140, 550, 650) and/or a base bracket (e.g., 150). The operations of the methods 1100, 1101 may be controlled by an operator, performed by a processor of a control system, or a combination thereof.

With reference to FIG. 11A, the method 1100 may include directing dielectric fluid to flow toward electronic equipment (e.g., 30) from at least one conduit aperture (e.g., 112, 114, 512, 612, 912) in a coolant conduit (e.g., 110) disposed within an immersion coolant tank (e.g., 10), in block 1110. In addition, the coolant conduit may include a lumen (e.g., 125) configured to receive the dielectric fluid. Also, the least one conduit aperture may extend through a sidewall of the coolant conduit. In some embodiments, directing the dielectric fluid to flow from the at least one conduit aperture may include directing the dielectric fluid to flow from a plurality of conduit apertures spaced along a longitudinal axis of the coolant conduit. In some embodiments, directing the dielectric fluid to flow toward the electronic equipment may comprise directing the dielectric fluid toward an inlet face of an enclosure or chassis of the electronic equipment.

In block 1120, the method may include sliding an aperture cover (e.g., 120, 520, 620, 720, 920) along an outer surface of the sidewall of the coolant conduit. In addition, sliding the aperture cover may control a flow of the dielectric fluid through the at least one conduit aperture. In some embodiments, sliding the aperture cover from at least a first position to a second position may enable a greater flow of dielectric fluid through the at least one conduit aperture. In such embodiments, sliding the aperture cover from at least the second position to the first position may enable a restricted flow of dielectric fluid through the at least one conduit aperture. In some embodiments, sliding from at least the first position to the second position may include a linear movement of the aperture cover extending parallel to a longitudinal axis of the coolant conduit. In some embodiments, sliding from at least the first position to the second position may include a rotational movement of the aperture cover around a longitudinal axis of the coolant conduit. In some embodiments, sliding the aperture cover along the outer surface of the sidewall may move the aperture cover to one of a fully open position, a semi-open position, and a closed position. The fully open position may enable a greater flow of dielectric fluid through the at least one conduit aperture than the semi-open position and the closed position may prevent flow of dielectric fluid through the at least one conduit aperture.

With reference to FIG. 11B, following the operations in block 1110 of the method 1100, the method 1101 may include activating an actuator (e.g., 130, 140, 550, 650) in block 1130. Sliding the aperture cover along the outer surface of the sidewall of the coolant conduit may be controlled by the actuator. Following the operations in block 1130, the process may follow the operations in block 1120 of the method 1100.

The foregoing descriptions of systems, devices, and methods are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are used to guide the reader through the description of the methods. Further, any reference to claim elements in the singular, for example, using the articles "a," "an" or "the" is not to be construed as limiting the element to the singular.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A fluid delivery device for electronic equipment immersed in an immersion coolant tank, comprising:
   a fluid delivery wand configured to selectively direct dielectric fluid toward the electronic equipment, the fluid delivery wand including:
      a coolant conduit extending from a support base of the immersion coolant tank, wherein the coolant conduit includes a lumen configured to receive dielectric fluid, wherein the coolant conduit includes at least one conduit aperture extending through a sidewall of the coolant conduit; and
      an aperture cover in sliding engagement with an outer surface of the sidewall of the coolant conduit, wherein the aperture cover is configured to selectively restrict flow of dielectric fluid through the at least one conduit aperture by sliding along the outer surface of the outer of the sidewall.

2. The fluid delivery device of claim 1, wherein the aperture cover includes at least one release aperture, wherein alignment of the at least one release aperture with the at least one conduit aperture enables dielectric fluid to flow through the at least one conduit aperture.

3. The fluid delivery device of claim 1, wherein by sliding along the outer surface of the sidewall, the aperture cover is configured to move between at least a first position and a second position, wherein the first position enables a greater flow of dielectric fluid through the at least one conduit aperture than the second position.

4. The fluid delivery device of claim 3, wherein the movement between at least the first position and the second position includes a linear movement of the aperture cover extending parallel to a longitudinal axis of the coolant conduit.

5. The fluid delivery device of claim 3, wherein the movement between at least the first position and the second position includes a rotational movement of the aperture cover around a longitudinal axis of the coolant conduit.

6. The fluid delivery device of claim 1, wherein by sliding along the outer surface of the sidewall, the aperture cover is configured to move between at least a fully open position, a semi-open position, and a closed position, wherein the fully open position enables a greater flow of dielectric fluid through the at least one conduit aperture than the semi-open position and the closed position prevents flow of dielectric fluid through the at least one conduit aperture.

7. The fluid delivery device of claim 1, wherein the at least one conduit aperture includes a plurality of conduit apertures spaced along a longitudinal axis of the coolant conduit.

8. The fluid delivery device of claim 1, further comprising:
   an actuator attached to the support base, wherein the actuator is configured to control a sliding movement of the aperture cover relative to the coolant conduit.

9. The fluid delivery device of claim 1, further comprising:
   a base bracket forming an enclosure with two opposed walls on opposite sides of the coolant conduit, wherein the two opposed walls are configured to together receive a component of the electronic equipment seated thereon.

10. The fluid delivery device of claim 9, wherein the two opposed walls extend parallel to a longitudinal axis of the coolant conduit.

11. The fluid delivery device of claim 1, wherein the aperture cover is formed as a conduit sleeve that surrounds a circumference of the coolant conduit.

12. The fluid delivery device of claim 1, wherein selectively directing dielectric fluid toward the electronic equipment comprises directing the dielectric fluid toward an inlet face of an enclosure or chassis of the electronic equipment.

13. A method of delivering fluid to an electronic equipment immersed in an immersion coolant tank, comprising:
   directing dielectric fluid to flow toward electronic equipment from at least one conduit aperture in a coolant conduit disposed within the immersion coolant tank, wherein the coolant conduit includes a lumen configured to receive the dielectric fluid, wherein the least one conduit aperture extends through a sidewall of the coolant conduit; and sliding an aperture cover along an outer surface of the sidewall of the coolant conduit, wherein sliding the aperture cover controls a flow of the dielectric fluid through the at least one conduit aperture.

14. The method of claim 13, wherein sliding the aperture cover from at least a first position to a second position enables a greater flow of dielectric fluid through the at least one conduit aperture.

15. The method of claim 14, wherein sliding from at least the first position to the second position includes a linear movement of the aperture cover extending parallel to a longitudinal axis of the coolant conduit.

16. The method of claim 14, wherein sliding from at least the first position to the second position includes a rotational movement of the aperture cover around a longitudinal axis of the coolant conduit.

17. The method of claim 13, wherein sliding the aperture cover along the outer surface of the sidewall moves the aperture cover to one of a fully open position, a semi-open position, and a closed position, wherein the fully open position enables a greater flow of dielectric fluid through the at least one conduit aperture than the semi-open position and the closed position prevents flow of dielectric fluid through the at least one conduit aperture.

18. The method of claim 13, wherein directing the dielectric fluid to flow from the at least one conduit aperture includes directing the dielectric fluid to flow from a plurality of conduit apertures spaced along a longitudinal axis of the coolant conduit.

19. The method of claim 13, further comprising:

activating an actuator, wherein sliding the aperture cover along the outer surface of the sidewall of the coolant conduit is controlled by the actuator.

20. The method of claim 13, wherein directing the dielectric fluid to flow toward the electronic equipment comprises directing the dielectric fluid toward an inlet face of an enclosure or chassis of the electronic equipment.

* * * * *